United States Patent
Hikosaka et al.

(10) Patent No.: US 9,673,284 B2
(45) Date of Patent: *Jun. 6, 2017

(54) NITRIDE SEMICONDUCTOR DEVICE, NITRIDE SEMICONDUCTOR WAFER, AND METHOD FOR FORMING NITRIDE SEMICONDUCTOR LAYER

(71) Applicant: Kabushiki Kaisha Toshiba, Minato-ku (JP)

(72) Inventors: Toshiki Hikosaka, Kanagawa-ken (JP); Yoshiyuki Harada, Tokyo (JP); Hisashi Yoshida, Tokyo (JP); Naoharu Sugiyama, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/688,290

(22) Filed: Apr. 16, 2015

(65) Prior Publication Data

US 2015/0221728 A1    Aug. 6, 2015

Related U.S. Application Data

(63) Continuation of application No. 13/780,456, filed on Feb. 28, 2013, now Pat. No. 9,054,036.

(30) Foreign Application Priority Data

Nov. 21, 2012 (JP) ................................ 2012-255290

(51) Int. Cl.
*H01L 29/06* (2006.01)
*H01L 29/20* (2006.01)
(Continued)

(52) U.S. Cl.
CPC ...... *H01L 29/2003* (2013.01); *H01L 21/0254* (2013.01); *H01L 29/205* (2013.01); *H01L 29/267* (2013.01); *H01L 33/32* (2013.01)

(58) Field of Classification Search
CPC ....... H01L 33/00; H01L 33/007; H01L 33/02; H01L 33/025; H01L 33/12; H01L 33/22
(Continued)

(56) References Cited

U.S. PATENT DOCUMENTS 6,312,967 B1 * 11/2001 Ikeda .................... H01L 33/007
                                                            257/103
6,316,785 B1    11/2001 Nunoue et al.
(Continued)

FOREIGN PATENT DOCUMENTS

CN          1529915 A       9/2004
EP       2 426 701 A1       3/2012
(Continued)

OTHER PUBLICATIONS

Combined Chinese Office Action and Search Report issued Dec. 24, 2015 in Patent Application No. 201310394029.8 (with English language translation and English language translation of categories of cited documents).

(Continued)

*Primary Examiner* — Meiya Li
*Assistant Examiner* — Peter M Albrecht
(74) *Attorney, Agent, or Firm* — Oblon, McClelland, Maier & Neustadt, L.L.P.

(57) ABSTRACT

According to one embodiment, a nitride semiconductor device includes a stacked body and a functional layer. The stacked body includes an AlGaN layer of $Al_xGa_{1-x}N$ (0<x≤1), a first Si-containing layer, a first GaN layer, a second Si-containing layer, and a second GaN layer. The first Si-containing layer contacts an upper surface of the
(Continued)

AlGaN layer. The first Si-containing layer contains Si at a concentration not less than $7 \times 10^{19}/cm^3$ and not more than $4 \times 10^{20}/cm^3$. The first GaN layer is provided on the first Si-containing layer. The first GaN layer includes a protrusion having an oblique surface tilted with respect to the upper surface. The second Si-containing layer is provided on the first GaN layer. The second Si-containing layer contains Si. The second GaN layer is provided on the second Si-containing layer. The functional layer is provided on the stacked body. The functional layer includes a nitride semiconductor.

30 Claims, 17 Drawing Sheets

(51) Int. Cl.
  *H01L 33/32* (2010.01)
  *H01L 21/02* (2006.01)
  *H01L 29/267* (2006.01)
  *H01L 29/205* (2006.01)

(58) Field of Classification Search
  USPC ........ 257/101–103, 190, 618, 623, E21.119, 257/E21.135, E33.028, E33.034
  See application file for complete search history.

(56) References Cited

U.S. PATENT DOCUMENTS

| | | | |
|---|---|---|---|
| 6,348,096 | B1 | 2/2002 | Sunakawa et al. |
| 6,566,231 | B2 | 5/2003 | Ogawa et al. |
| 7,910,937 | B2 | 3/2011 | Chen et al. |
| 9,054,036 | B2 * | 6/2015 | Hikosaka ............ H01L 21/0254 |
| 2002/0066403 | A1 | 6/2002 | Sunakawa et al. |
| 2002/0100412 | A1 | 8/2002 | Hirayama et al. |
| 2002/0167028 | A1 | 11/2002 | Kunisato et al. |
| 2003/0057444 | A1 | 3/2003 | Niki et al. |
| 2003/0183160 | A1 | 10/2003 | Fujikura et al. |
| 2005/0001227 | A1 | 1/2005 | Niki et al. |
| 2006/0261353 | A1 | 11/2006 | Bandoh |
| 2007/0197004 | A1 | 8/2007 | Dadgar et al. |
| 2008/0217645 | A1 | 9/2008 | Saxler et al. |
| 2008/0303043 | A1 | 12/2008 | Niki et al. |
| 2009/0042328 | A1 | 2/2009 | Niki et al. |
| 2009/0283782 | A1 | 11/2009 | Shakuda |
| 2009/0315067 | A1 | 12/2009 | Huang et al. |
| 2010/0264445 | A1 | 10/2010 | Niki et al. |
| 2010/0264446 | A1 | 10/2010 | Niki et al. |
| 2010/0264447 | A1 | 10/2010 | Niki et al. |
| 2010/0266815 | A1 | 10/2010 | Niki et al. |
| 2010/0267181 | A1 | 10/2010 | Niki et al. |
| 2010/0320506 | A1 | 12/2010 | Varangis et al. |
| 2012/0058626 | A1 | 3/2012 | Sugiyama et al. |
| 2012/0187369 | A1 | 7/2012 | Jeong et al. |
| 2012/0292593 | A1 | 11/2012 | Shioda et al. |
| 2013/0183496 | A1 | 7/2013 | Niki et al. |
| 2013/0196487 | A1 | 8/2013 | Sugiyama et al. |

FOREIGN PATENT DOCUMENTS

| | | |
|---|---|---|
| EP | 2 525 407 A2 | 11/2012 |
| JP | 2000-183464 | 6/2000 |
| JP | 2002-170776 A | 6/2002 |
| JP | 2002-170776 A5 | 6/2002 |
| JP | 2003-277196 A | 10/2003 |
| JP | 2004-047764 | 2/2004 |
| JP | 2006-313771 | 11/2006 |
| JP | 2007-059719 | 3/2007 |
| JP | 2009-084136 A | 4/2009 |
| JP | 2010-010675 A | 1/2010 |
| JP | 2011-233936 | 11/2011 |
| JP | 2012-079824 | 4/2012 |
| JP | 2012-094905 A | 5/2012 |
| JP | 2012-186449 | 9/2012 |

OTHER PUBLICATIONS

Extended European Search Report issued Mar. 27, 2014 in Patent Application No. 13180095.5.
Korean Office Action issued Aug. 28, 2014, in Korea Patent Application No. 10-2013-104723 (with English translation).
Satoshi Kamiyama et al: "Low-temperature-deposited AlGaN interlayer for improvement of AlGaN/GaN heterostructure", Journal of Crystal Growth, vol. 223. No. 1-2, Feb. 2001, pp. 83-91, XP055156545.
Extended European Search Report dated Dec. 11, 2014, in European Patent Application No. 14174748.5.
Korean Office Action dated Jan. 26, 2015, in Korean Patent Application No. 10-2014-0145357 (12 pages, with English Translation).
Office Action issued on Jul. 25, 2016 in Japanese Patent Application No. 2013-126145 (with unedited computer generated English language translation).
Office Action issued on May 17, 2016 in Chinese Patent Application No. 201310394029.8 (with English language translation).
Korean Office Action issued Oct. 26, 2015 in Patent Application No. 10-2014-0145357 (with English language translation).

* cited by examiner

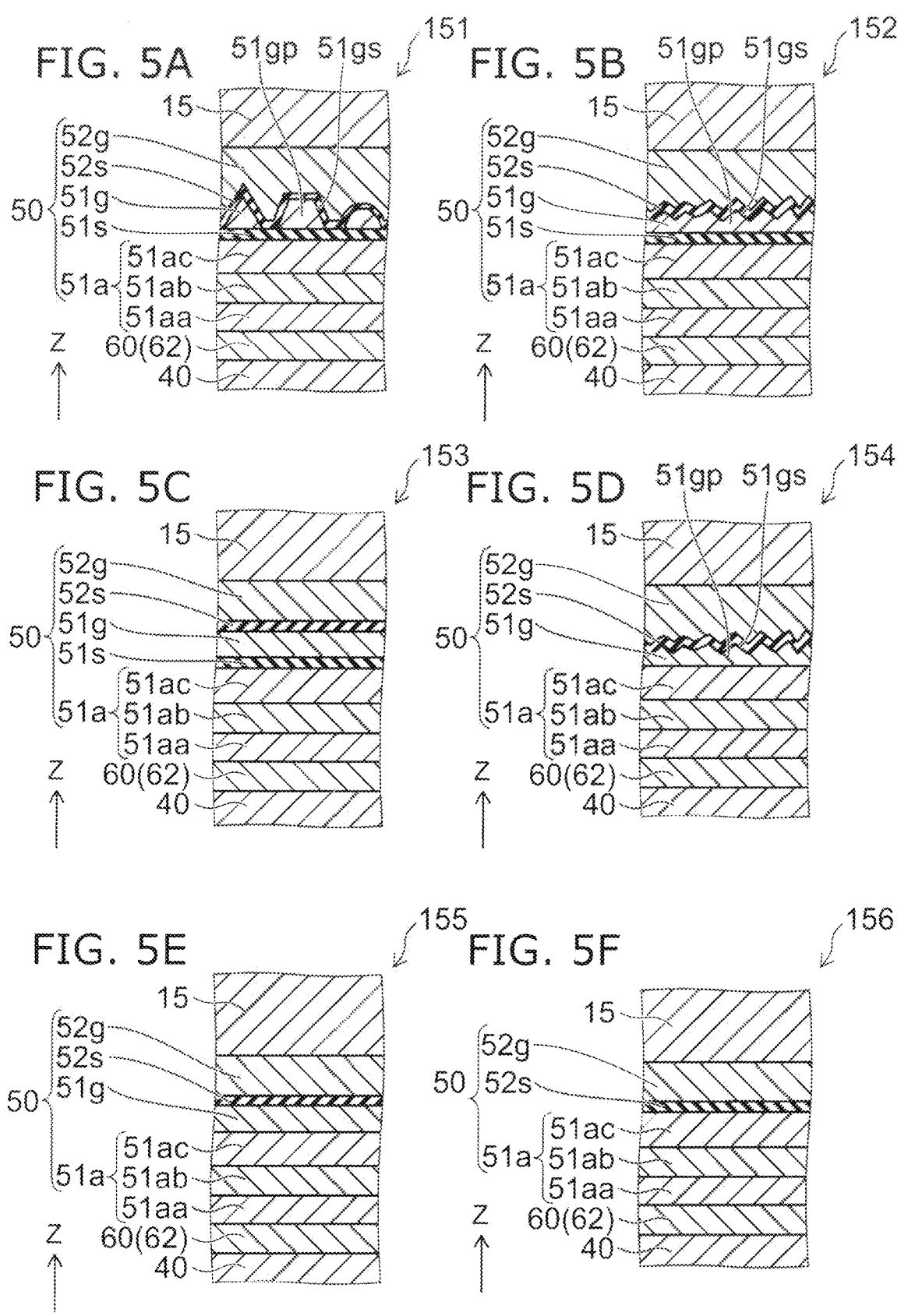

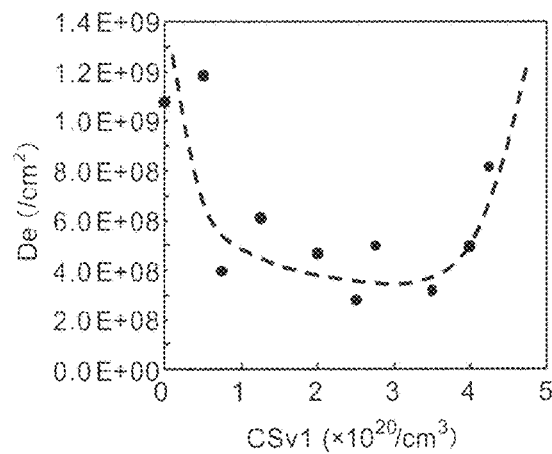
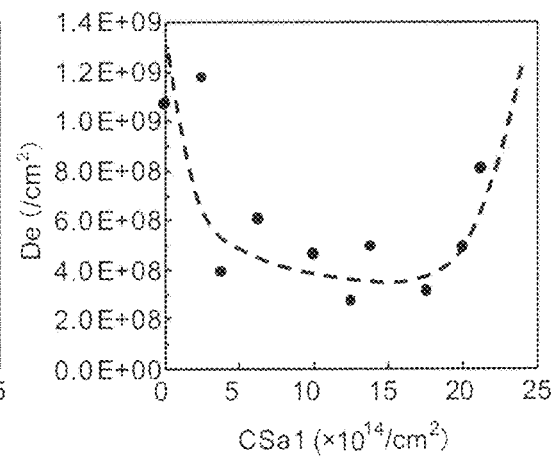
FIG. 13A          FIG. 13B
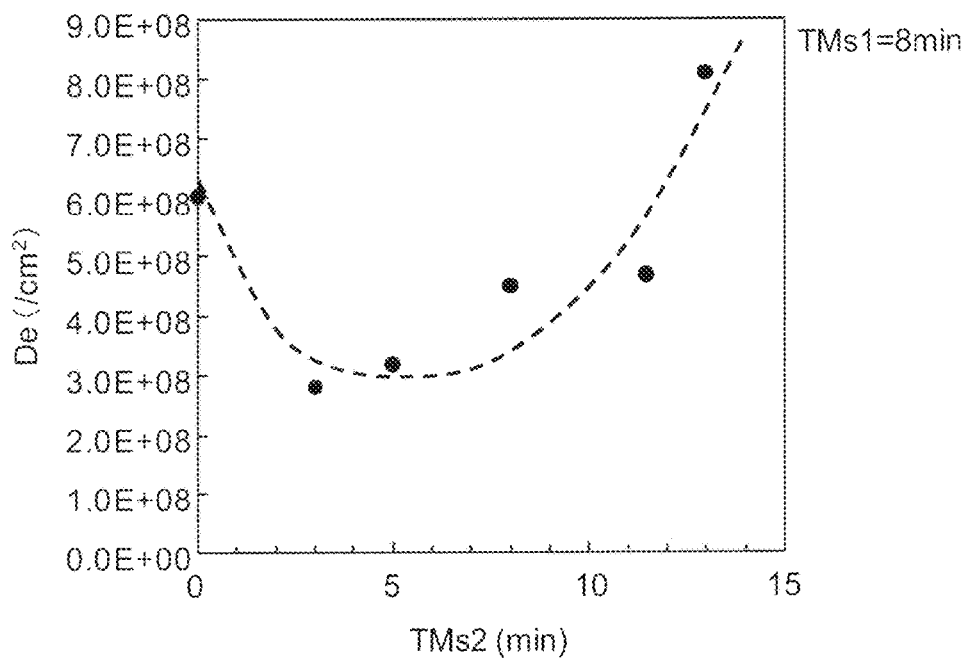
FIG. 14

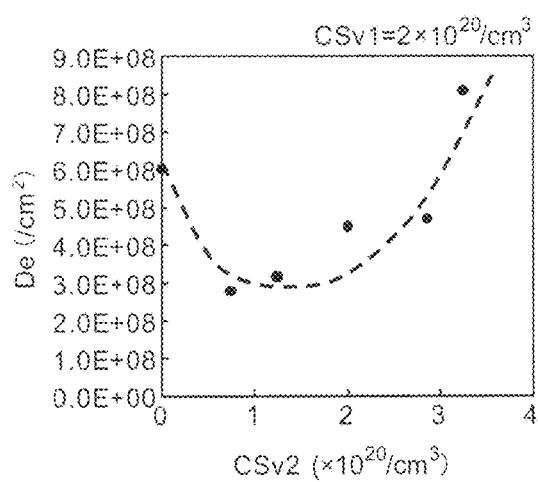
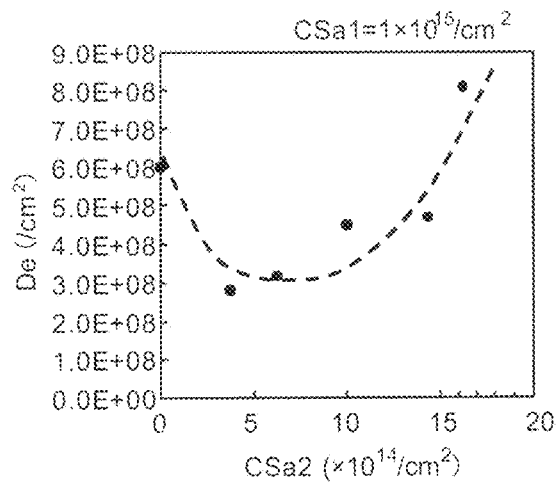
FIG. 15A  FIG. 15B
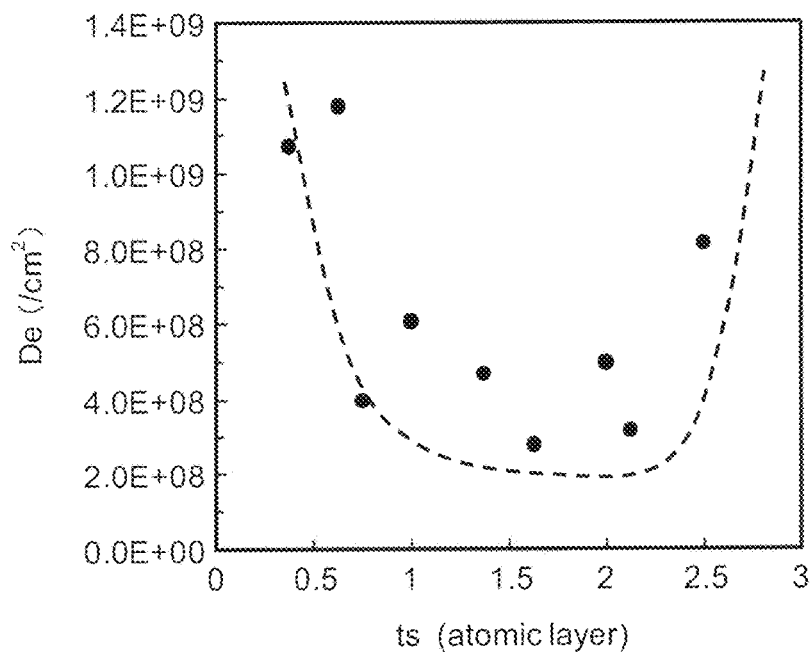
FIG. 16

NITRIDE SEMICONDUCTOR DEVICE, NITRIDE SEMICONDUCTOR WAFER, AND METHOD FOR FORMING NITRIDE SEMICONDUCTOR LAYER

CROSS-REFERENCE TO RELATED APPLICATIONS

This application is a continuation of U.S. patent application Ser. No. 13/780,456, filed Feb. 28, 2013, the disclosure of which is incorporated herein by reference in its entirety. This application claims priority to Japanese Application Number 2012-255290, filed Nov. 21, 2012, the disclosure of which is incorporated herein by reference in its entirety.

FIELD

Embodiments described herein relate generally to a nitride semiconductor device, a nitride semiconductor wafer, and a method for forming a nitride semiconductor layer.

BACKGROUND

Light emitting diodes (LEDs), which are examples of semiconductor light emitting devices that use nitride semiconductors, are used in, for example, display devices, illumination, etc. Electronic devices that use nitride semiconductors are utilized in high-speed electronic devices and power devices.

To provide high performance in such nitride semiconductor devices, it is important to reduce the defects inside the nitride semiconductor layer. Technology to make a nitride semiconductor crystal having few dislocations is desirable.

BRIEF DESCRIPTION OF THE DRAWINGS

FIG. 5A to FIG. 5F are schematic cross-sectional views of the samples;

FIG. 13A and FIG. 13B are graphs showing characteristics of the nitride semiconductor device according to the first embodiment;

FIG. 14 is a graph showing a characteristic of the nitride semiconductor device according to the first embodiment;

FIG. 15A and FIG. 15B are graphs showing characteristics of the nitride semiconductor device according to the first embodiment;

FIG. 16 is a graph showing a characteristic of the nitride semiconductor device according to the first embodiment;

DETAILED DESCRIPTION

Figure 1:
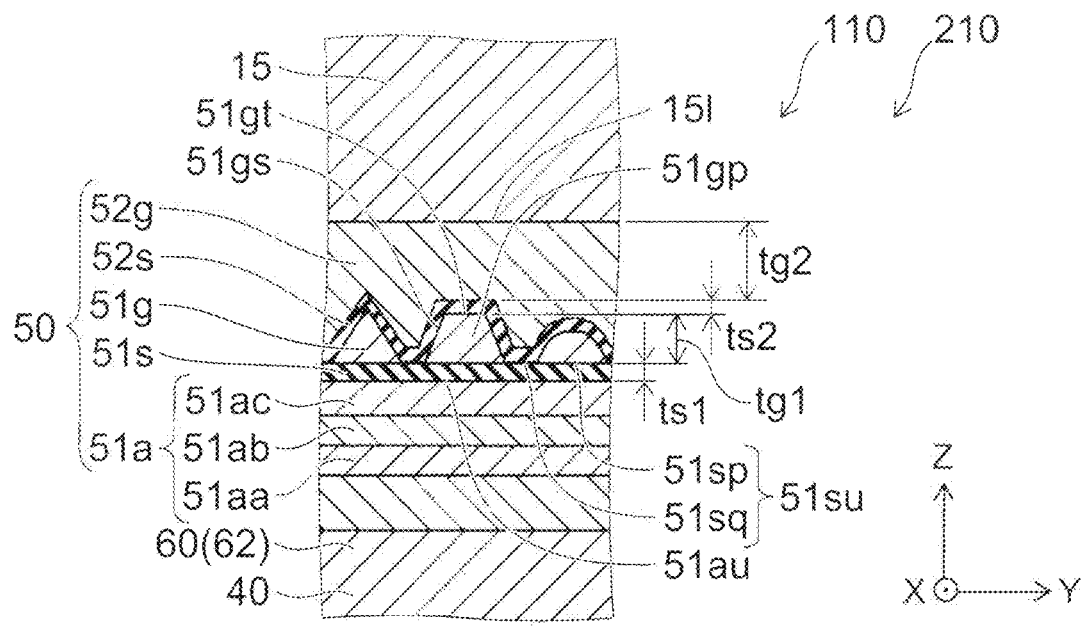
FIG. 1 is a schematic cross-sectional view showing the nitride semiconductor device according to the first embodiment.

According to one embodiment, a nitride semiconductor device includes a stacked body and a functional layer. The stacked body includes an AlGaN layer of $Al_xGa_{1-x}N$ ($0<x\le1$), a first Si-containing layer, a first GaN layer, a second Si-containing layer, and a second GaN layer. The first Si-containing layer contacts an upper surface of the AlGaN layer. The first Si-containing layer contains Si at a concentration not less than $7\times10^{19}/cm^3$ and not more than $4\times10^{20}/cm^3$. The first GaN layer is provided on the first Si-containing layer. The first GaN layer includes a protrusion having an oblique surface tilted with respect to the upper surface. The second Si-containing layer is provided on the first GaN layer. The second Si-containing layer contains Si. The second GaN layer is provided on the second Si-containing layer. The functional layer is provided on the stacked body. The functional layer includes a nitride semiconductor.

According to one embodiment, a nitride semiconductor wafer includes a substrate, a buffer layer and a stacked body. The buffer layer is provided on the substrate. The buffer layer includes a nitride semiconductor. The stacked body is provided on the buffer layer. The stacked body includes an AlGaN layer of $Al_xGa_{1-x}N$ ($0<x\le1$), a first Si-containing layer, a first GaN layer, a second Si-containing layer and a second GaN layer. The first Si-containing layer contacts an upper surface of the AlGaN layer. The first Si-containing layer contains Si at a concentration not less than $7\times10^{19}/cm^3$ and not more than $4\times10^{20}/cm^3$. The first GaN layer is provided on the first Si-containing layer. The first GaN layer includes a protrusion having an oblique surface tilted with respect to the upper surface. The second Si-containing layer is provided on the first GaN layer. The second Si-containing layer contains Si. The second GaN layer is provided on the second Si-containing layer.

According to one embodiment, a method for forming a nitride semiconductor layer is provided. The method can include forming an AlGaN layer of $Al_xGa_{1-x}N$ ($0<x\leq1$) on a buffer layer provided on a substrate, the buffer layer including a nitride semiconductor. The method can include forming a first Si-containing layer contacting an upper surface of the AlGaN layer, the first Si-containing layer containing Si at a concentration not less than $7\times10^{19}/cm^3$ and not more than $4\times10^{20}/cm^3$. The method can include forming a first GaN layer on the first Si-containing layer, the first GaN layer including a protrusion having an oblique surface tilted with respect to the upper surface. The method can included forming a second Si-containing layer containing Si on the first GaN layer. The method can include forming a second GaN layer on the second Si-containing layer.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a nitride semiconductor device and a nitride semiconductor wafer. The nitride semiconductor device according to the embodiment includes a semiconductor device such as a semiconductor light emitting device, a semiconductor light receiving device, an electronic device, etc. The semiconductor light emitting device includes, for example, a light emitting diode (LED), a laser diode (LD), etc. The semiconductor light receiving device includes a photodiode (PD), etc. The electronic device includes, for example, a high electron mobility transistor (HEMT), a heterojunction bipolar transistor (HBT), a field effect transistor (FET), a Schottky barrier diode (SBD), etc. The nitride semiconductor wafer according to the embodiment includes at least a portion of the nitride semiconductor device according to the embodiment.

FIG. 1 is a schematic cross-sectional view illustrating the nitride semiconductor device according to the first embodiment.

The nitride semiconductor device 110 according to the embodiment as shown in FIG. 1 includes a stacked body 50 and a functional layer 15. The functional layer 15 is provided on the stacked body 50.

In the example, the nitride semiconductor device 110 further includes a buffer layer 60. The buffer layer 60 includes a nitride semiconductor. The stacked body 50 is provided on the buffer layer 60. In the example, an AlN buffer layer 62 is used as the buffer layer 60.

In the example, the nitride semiconductor device 110 further includes a substrate 40. The buffer layer 60 is disposed between the substrate 40 and the stacked body 50.

The substrate 40 is, for example, a silicon substrate. For example, a Si (111) substrate is used as the substrate 40. In the case where a silicon substrate is used as the substrate 40, the plane orientation of the silicon substrate may be, for example, a (11n) (n being an integer) plane orientation. The plane orientation may be, for example, the (100) plane. It is favorable for, for example, a silicon substrate of the (110) plane to be used as the substrate 40. Thereby, the lattice mismatch between the silicon substrate and the nitride semiconductor layer is small.

A substrate including an oxide layer may be used as the substrate 40. For example, an SOI (silicon on insulator) substrate may be used as the substrate 40. A substrate of a material having a lattice constant that is different from the lattice constant of the functional layer 15 may be used as the substrate 40. A substrate of a material having a coefficient of thermal expansion that is different from the coefficient of thermal expansion of the functional layer 15 may be used as the substrate 40. For example, a substrate of one selected from sapphire, spinel, GaAs, InP, ZnO, Ge, SiGe, and SiC may be used as the substrate 40.

For example, the buffer layer 60 is formed on the substrate 40. The stacked body 50 is formed on the buffer layer 60. The functional layer 15 is formed on the stacked body 50. Epitaxial growth is performed to form these layers.

In the embodiment, at least a portion of the substrate 40 may be removed after forming each of the layers. In the embodiment, at least a portion of the buffer layer 60 may be removed after forming each of the layers.

As shown in FIG. 1, the stacked body 50 includes an AlGaN layer 51a, a first Si-containing layer 51s, a first GaN layer 51g, a second Si-containing layer 52s, and a second GaN layer 52g.

The AlGaN layer 51a may include $Al_xGa_{1-x}N$ ($0<x\leq1$). The AlGaN layer 51a has an upper surface 51au.

The AlGaN layer 51a may include one layer or multiple layers. In the example, the AlGaN layer 51a includes a first AlGaN layer 51aa, a second AlGaN layer 51ab, and a third AlGaN layer 51ac. The number of layers included in the AlGaN layer 51a may be two, four, or more. The second AlGaN layer 51ab is provided on the first AlGaN layer 51aa. The third AlGaN layer 51ac is provided on the second AlGaN layer 51ab. The Al composition ratio (the composition ratio of Al in the III elements) of the second AlGaN layer 51ab is lower than the Al composition ratio of the first AlGaN layer 51aa. The Al composition ratio of the third AlGaN layer 51ac is lower than the Al composition ratio of the second AlGaN layer 51ab.

The first Si-containing layer 51s contacts the upper surface 51au of the AlGaN layer 51a. Thus, the first Si-containing layer 51s is provided on the AlGaN layer 51a. The first Si-containing layer 51s contains Si at a concentration that is not less than $7\times10^{19}/cm^3$ and not more than $4\times10^{20}/cm^3$. The first Si-containing layer 51s has an upper surface 51su. The upper surface 51su of the first Si-containing layer 51s is substantially parallel to the upper surface 51au of the AlGaN layer 51a.

The first GaN layer 51g is provided on the first Si-containing layer 51s. The first GaN layer 51g contacts the upper surface 51su of the first Si-containing layer 51s. The first GaN layer 51g includes a protrusion 51gp. The protrusion 51gp has an oblique surface 51gs. The oblique surface 51gs is tilted with respect to the upper surface 51au of the AlGaN layer 51a. The oblique surface 51gs may be a curved surface.

Other than the oblique surface 51gs, the protrusion 51gp may include a top surface 51gt. The top surface 51gt is parallel to the upper surface 51au of the AlGaN layer 51a. It is not always necessary to provide a top surface 51gt that is parallel to the upper surface 51au of the AlGaN layer 51a in the protrusion 51gp.

The first GaN layer 51g has, for example, an island configuration. The film having the island configuration also is called a layer. Multiple independent protrusions 51*gp* may be provided. The first GaN layer 51*g* may be continuous.

The second Si-containing layer 52*s* is provided on the first GaN layer 51*g*. The second Si-containing layer 52*s* contacts the first GaN layer 51*g*. The second Si-containing layer 52*s* contains Si. For example, the second Si-containing layer 52*s* covers the first GaN layer 51*g*.

In the example, a portion of the second Si-containing layer 52*s* contacts the first Si-containing layer 51*s*. For example, the upper surface 51*su* of the first Si-containing layer 51*s* has a first region 51*sp* and a second region 51*sq*. The first GaN layer 51*g* is provided on the first region 51*sp*. For example, the protrusion 51*gp* of the first GaN layer 51*g* is provided on the first region 51*sp*. The first GaN layer 51*g* is not provided on the second region 51*sq*. A portion of the second Si-containing layer 52*s* contacts the first Si-containing layer 51*s* in the second region 51*sq*.

As described below, the first GaN layer 51*g* may cover the upper surface 51*su* of the first Si-containing layer 51*s*. In such a case, the second Si-containing layer 52*s* does not contact the first Si-containing layer 51*s*.

An example of the case (the nitride semiconductor device 110) where a portion of the second Si-containing layer 52*s* contacts the first Si-containing layer 51*s* will now be described.

The second Si-containing layer 52*s* conforms to the configuration of the first GaN layer 51*g* (the configuration of the protrusion 51*gp*). The upper surface of the second Si-containing layer 52*s* has an uneven configuration conforming to the configuration of the protrusion 51*gp*.

The second GaN layer 52*g* is provided on the second Si-containing layer 52*s*. The recesses of the unevenness of the first GaN layer 51*g* (the unevenness of the second Si-containing layer 52*s*) are filled with the second GaN layer 52*g*. The upper surface of the second GaN layer 52*g* is substantially flat.

The first GaN layer 51*g* includes, for example, $Al_{z1}Ga_{1-z1}N$ ($0 \leq z1 < 1$ and $z1 < x$). The first GaN layer 51*g* may include, for example, GaN. The first GaN layer 51*g* may include an n-type impurity.

The second GaN layer 52*g* includes, for example, $Al_{z2}Ga_{1-z2}N$ ($0 \leq z2 < 1$ and $z2 < x$). The second GaN layer 52*g* may include, for example, GaN. The second GaN layer 52*g* may include an n-type impurity.

For example, at least one selected from Si, Ge, Te, Sb, and O is used as the n-type impurity.

A direction perpendicular to the upper surface 51*au* of the AlGaN layer 51*a* is taken as a Z-axis direction. One direction perpendicular to the Z-axis direction is taken as an X-axis direction. A direction perpendicular to the Z-axis direction and the X-axis direction is taken as a Y-axis direction.

The functional layer 15 is stacked with the stacked body 50 along the Z-axis direction. In the specification of the application, being "stacked" includes not only the case of being overlaid with mutual contact but also the case of being overlaid with another layer inserted therebetween. Further, being "provided on" includes not only the case of being provided in direct contact but also the case of being provided with another layer inserted therebetween.

The Z-axis direction is perpendicular to the upper surface 51*su* of the first Si-containing layer 51*s*. An interface 151 between the stacked body 50 and the functional layer 15 is perpendicular to the Z-axis direction.

The thickness of the AlGaN layer 51*a* is, for example, not less than 100 nanometers (nm) and not more than 500 nm (e.g., about 250 nm). The composition ratio of Al in the Group III elements of the AlGaN layer 51*a* is, for example, not less than 0.15 and not more than 0.35 (e.g., 0.25).

A thickness ts1 of the first Si-containing layer 51*s* is, for example, not less than 0.4 atomic layers thick and not more than 2 atomic layers thick. The thickness ts1 is, for example, not less than 0.1 nm and not more than 2 nm. The first Si-containing layer 51*s* may not be a uniform film and may be a film having a discontinuous island configuration, etc. The first Si-containing layer 51*s* may be a film in which an opening is provided.

A height tg1 of the protrusion 51*gp* of the first GaN layer 51*g* is, for example, not less than 100 nm and not more than 1000 nm. In the case where the first GaN layer 51*g* is provided on a portion of the first Si-containing layer 51*s* as in the example, the height tg1 of the protrusion 51*gp* is the distance between the upper surface 51*su* of the first Si-containing layer 51*s* and the upper end of the protrusion 51*gp* of the first GaN layer 51*g*. In the case where the protrusion 51*gp* has the top surface 51*gt*, the height tg1 is the distance between the upper surface 51*su* of the first Si-containing layer 51*s* and the top surface 51*gt*. The height tg1 of the protrusion 51*gp* of the first GaN layer 51*g* is taken to be the distance between the upper surface 51*su* of the first Si-containing layer 51*s* and the upper end of the protrusion 51*gp* of the first GaN layer 51*g* for the protrusion 51*gp* of the first GaN layer 51*g* having the highest height.

As described below, the first GaN layer 51*g* may cover the first Si-containing layer 51*s*. In such a case, the height of the protrusion 51*gp* of the first GaN layer 51*g* corresponds to the height (the depth) of the unevenness of the first GaN layer 51*g*, i.e., the distance along the Z-axis direction between the protrusions and the recesses of the unevenness.

The protrusion 51*gp* is provided in the first GaN layer 51*g*; and the thickness of the first GaN layer 51*g* is nonuniform. The thickness of the first GaN layer 51*g* is different from the height tg1 of the protrusion 51*gp* of the first GaN layer 51*g*. The thickness of the first GaN layer 51*g* is taken to be the average thickness of the first GaN layer 51*g*.

A thickness ts2 of the second Si-containing layer 52*s* is, for example, not less than 0.4 atomic layers thick and not more than 1.5 atomic layers thick. The thickness ts2 is, for example, not less than 0.1 nm and not more than 1.5 nm. The second Si-containing layer 52*s* may not be a uniform film and may be a film having a discontinuous island configuration, etc. The second Si-containing layer 52*s* may be a film in which an opening is provided.

A thickness tg2 of the second GaN layer 52*g* is, for example, not less than 100 nm and not more than 5000 nm. The thickness tg2 of the second GaN layer 52*g* is the distance along the Z-axis direction between the upper end of the second Si-containing layer 52*s* and the upper surface of the second GaN layer 52*g* (in the example, the interface 151 between the stacked body 50 and the functional layer 15).

The thickness of the AlGaN layer 51*a*, the thickness ts1 of the first Si-containing layer 51*s*, the thickness of the first GaN layer 51*g*, and the thickness ts2 of the second Si-containing layer 52*s* are lengths along the Z-axis direction. The thickness of the second Si-containing layer 52*s* is, for example, the length of the portion of the second Si-containing layer 52*s* provided on the oblique surface 51*gs* of the protrusion 51*gp* of the first GaN layer 51*g* along a direction perpendicular to the oblique surface 51*gs*.

These thicknesses can be determined from, for example, scanning electron microscope (SEM) images and/or transmission electron microscope (TEM) images.

The thickness of the functional layer 15 is, for example, not less than about 1.5 micrometers (μm) and not more than 5 μm (e.g., 2 μm).

The functional layer 15 may include, for example, a layer of a semiconductor light emitting device that functions to emit light. The functional layer 15 may include, for example, a layer of a semiconductor light receiving device that functions to receive light. The functional layer 15 may include, for example, a layer of an electronic device that functions to perform at least one selected from rectifying, switching, and amplifying. An example of the case where the functional layer 15 includes a layer that functions to emit light will now be described.

Figure 2:
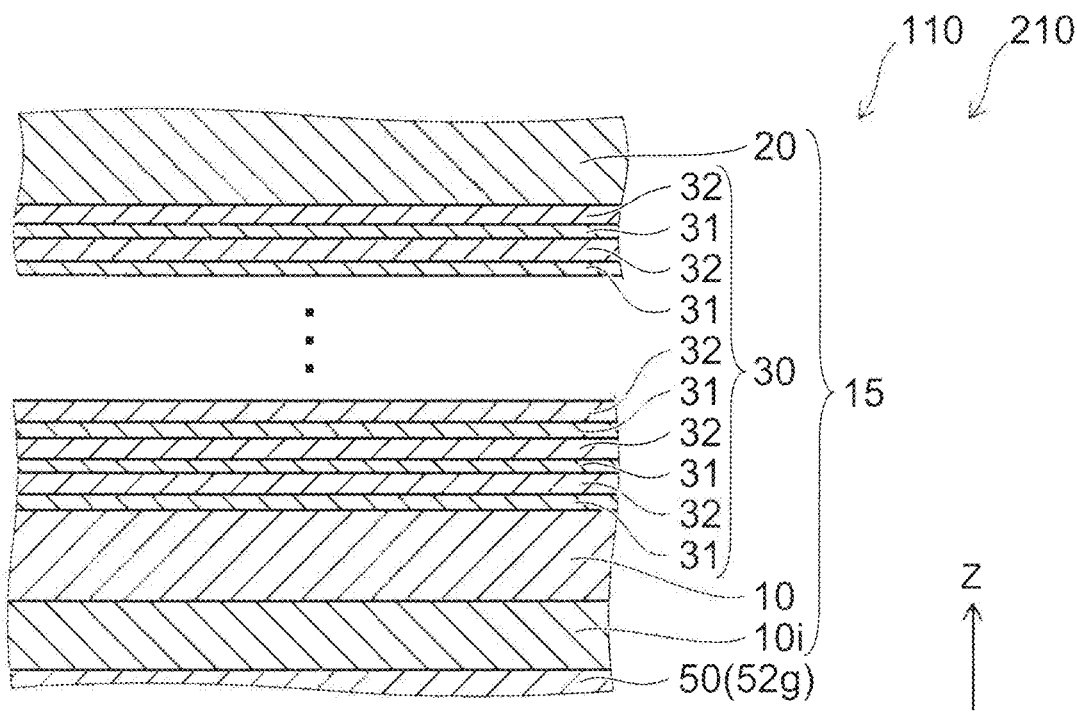
FIG. 2 is a schematic cross-sectional view showing a portion of the nitride semiconductor device according to the first embodiment.

FIG. 2 is a schematic cross-sectional view illustrating a portion of the nitride semiconductor device according to the first embodiment.

FIG. 2 shows an example of the configuration of the functional layer 15. In the example as shown in FIG. 2, the functional layer 15 includes an n-type semiconductor layer 10, a p-type semiconductor layer 20, and a light emitting layer 30. The light emitting layer 30 is provided between the n-type semiconductor layer 10 and the p-type semiconductor layer 20. The n-type semiconductor layer 10 includes a nitride semiconductor. The p-type semiconductor layer 20 includes a nitride semiconductor. The light emitting layer 30 includes a nitride semiconductor.

The functional layer 15 may further include a low impurity concentration layer 10i. The impurity concentration of the low impurity concentration layer 10i is lower than the impurity concentration of the n-type semiconductor layer 10. The low impurity concentration layer 10i may be provided if necessary and may be omitted. The low impurity concentration layer 10i is provided on the stacked body 50.

The n-type semiconductor layer 10 is provided on the stacked body 50. The n-type semiconductor layer 10 is provided on the low impurity concentration layer 10i. The light emitting layer 30 is provided on the n-type semiconductor layer 10. The p-type semiconductor layer 20 is provided on the light emitting layer 30.

The light emitting layer 30 includes multiple barrier layers 31, and a well layer 32 provided between the multiple barrier layers 31. The number of the well layers 32 may be one or multiple. In other words, the light emitting layer 30 has, for example, a SQW (Single-Quantum Well) structure or a MQW (Multi-Quantum Well) structure.

The bandgap energy of the barrier layer 31 is greater than the bandgap energy of the well layer 32. The well layer 32 may include, for example, InGaN. The barrier layer 31 includes GaN. In the case where the barrier layer 31 includes InGaN, the In composition ratio of the barrier layer 31 is smaller than the In composition ratio of the well layer 32. The peak wavelength of the light emitted from the light emitting layer 30 is, for example, not less than 200 nm and not more than 1900 nm.

FIG. 1 and FIG. 2 also illustrate the configuration of a nitride semiconductor wafer 210 according to the embodiment. The nitride semiconductor wafer 210 includes the substrate 40, the buffer layer 60, and the stacked body 50. The nitride semiconductor wafer 210 may further include the functional layer 15. The configurations described in regard to the nitride semiconductor device 110 are applicable to the substrate 40, the buffer layer 60, the stacked body 50, and the functional layer 15.

An example of a method for manufacturing the nitride semiconductor device and the nitride semiconductor wafer according to the embodiment will now be described.

For example, a silicon substrate having a major surface that is the (111) plane is used as the substrate 40. The substrate 40 is cleaned using, for example, a mixed chemical liquid of sulfuric acid and hydrogen peroxide and by using dilute hydrofluoric acid. After the cleaning, the substrate 40 is introduced to the reaction chamber of a MOCVD apparatus.

The substrate 40 is heated to, for example, 1080° C. Trimethylaluminum (TMAl) and ammonia ($NH_3$) are supplied for 20 minutes at flow rates of 50 cc/min and 0.8 L/min, respectively, in a mixed atmosphere of hydrogen and nitrogen having a proportion of 2:1. Thereby, the buffer layer 60 of AlN (the AlN buffer layer 62) is formed. The thickness of the AlN buffer layer 62 is, for example, about 100 nm.

The substrate temperature (the temperature of the substrate 40) is set to be 1040° C. Trimethylgallium (TMGa), TMAl, and ammonia are supplied for 5 minutes at flow rates of 10 cc/min, 50 cc/min, and 2.5 L/min, respectively, in a mixed atmosphere of hydrogen and nitrogen having a proportion of 2:1. Thereby, the first AlGaN layer 51aa is formed. The Al composition ratio of the first AlGaN layer 51aa is 0.55. The thickness of the first AlGaN layer 51aa is, for example, about 100 nm.

The flow rate of the TMGa is modified to 17 cc/min; the flow rate of the TMAl is modified to 30 cc/min; and the TMGa and the TMAl are supplied for 10 minutes. Thereby, the second AlGaN layer 51ab is formed. The Al composition ratio of the second AlGaN layer 51ab is, for example, 0.3. The thickness of the second AlGaN layer 51ab is, for example, about 200 nm.

The flow rate of the TMGa is modified to 20 cc/min; the flow rate of the TMAl is modified to 15 cc/min; and the TMGa and the TMAl are supplied for 11 minutes. Thereby, the third AlGaN layer 51ac is formed. The Al composition ratio of the third AlGaN layer 51ac is, for example, 0.15. The thickness of the third AlGaN layer 51ac is, for example, about 250 nm.

The substrate temperature is maintained as-is at 1040° C.; and silane ($SiH_4$) having a concentration of 10 ppm and ammonia are supplied for 8 minutes at flow rates of 350 cc/min and 20 L/min, respectively, in a mixed atmosphere of hydrogen and nitrogen having a proportion of 2:1. Thereby, the first Si-containing layer 51s is formed. The thickness of the first Si-containing layer 51s is, for example, about 1 atomic layer thick. The Si concentration of the first Si-containing layer 51s is, for example, $2 \times 10^{20}/cm^3$.

The substrate temperature is set to be 1090° C.; and TMGa and ammonia are supplied for 5 minutes at flow rates of 56 cc/min and 40 L/min, respectively, in a mixed atmosphere of hydrogen and nitrogen having a proportion of 2:1. Thereby, the first GaN layer 51g is formed. For example, the first GaN layer 51g is a crystal having an island configuration. The protrusion 51gp of the first GaN layer 51g includes the oblique surface 51gs tilted with respect to the X-Y plane. The height tg1 of the protrusion 51gp of the first GaN layer 51g is, for example, about 400 nm.

The substrate temperature is set to be 1040° C. Silane ($SiH_4$) having a concentration of 10 ppm and ammonia are supplied for 3 minutes at flow rates of 350 cc/min and 20 L/min, respectively, in a mixed atmosphere of hydrogen and nitrogen having a proportion of 2:1. Thereby, the second Si-containing layer 52s is formed. The thickness of the second atomic Si-containing layer 52s is, for example, about 0.4 atomic layers thick. The Si concentration of the second Si-containing layer 51s is, for example, $7.5 \times 10^{19}/cm^3$.

The substrate temperature is set to be 1090° C.; and TMGa and ammonia are supplied for 60 minutes at flow rates of 56 cc/min and 40 L/min, respectively, in a mixed atmosphere of hydrogen and nitrogen having a proportion of 2:1. Thereby, the second GaN layer 52g is formed. The thickness of the second GaN layer 52g is, for example, about 2 μm.

Further, TMGa, ammonia, and silane ($SiH_4$) having a concentration of 10 ppm are supplied for 30 minutes at flow rates of 56 cc/min, 40 L/min, and 56 cc/min, respectively. Thereby, an n-type GaN layer is formed. The Si concentration of the n-type GaN layer is, for example, $5\times10^{18}$ (/$cm^3$). The thickness of the n-type GaN layer is, for example, about 1 μm. The n-type GaN layer is used as the n-type semiconductor layer 10 (at least a portion of the functional layer 15). Thereby, the nitride semiconductor device or the nitride semiconductor wafer according to the embodiment can be formed.

The low impurity concentration layer 10i may be formed prior to forming the n-type GaN layer. The nitride semiconductor device 110 and the nitride semiconductor wafer 210 can be formed by further forming the light emitting layer 30 and the p-type semiconductor layer 20 on the n-type semiconductor layer 10.

Figure 3A:
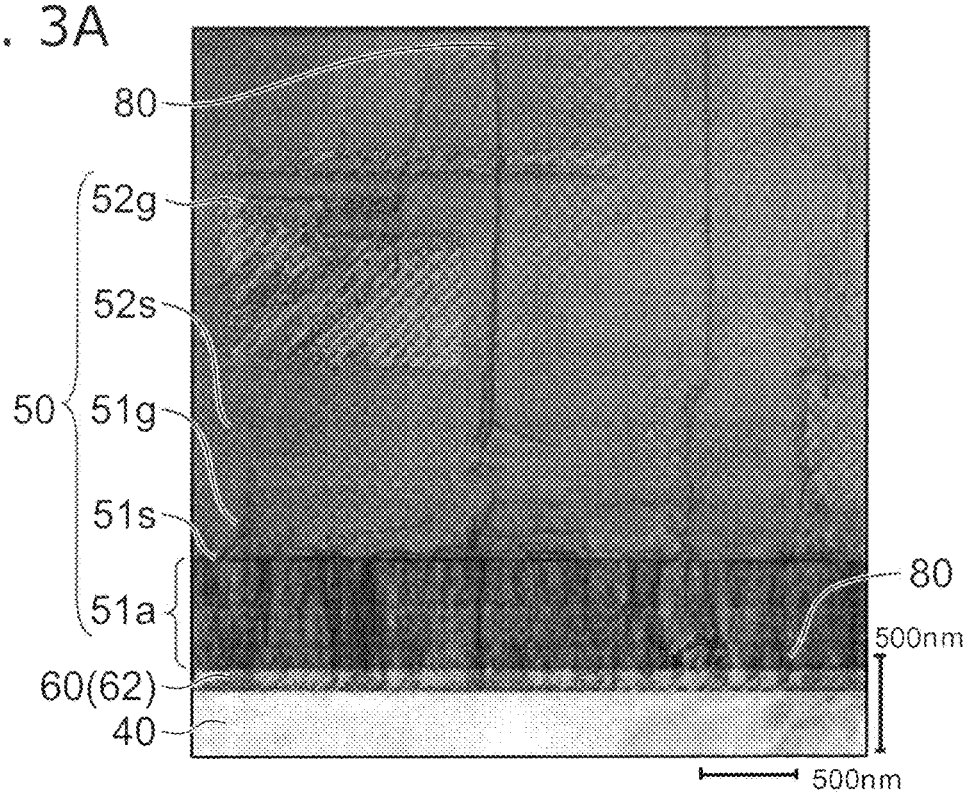
FIG. 3A and FIG. 3B show the nitride semiconductor device according to the first embodiment.
Figure 3B:
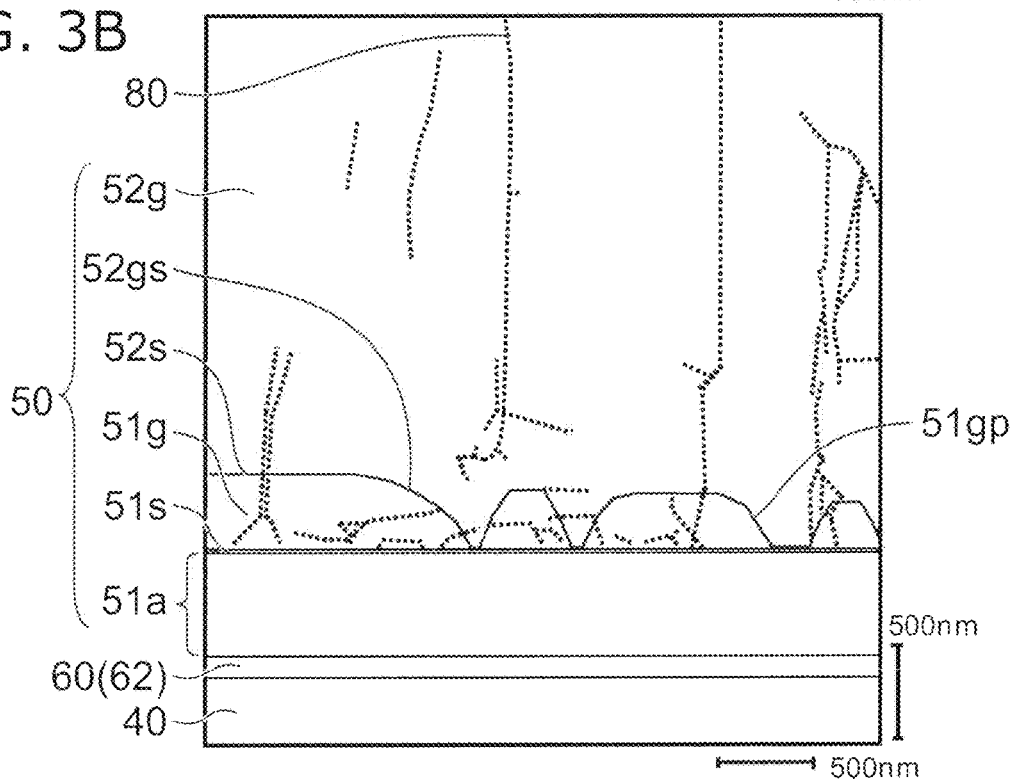

FIG. 3A and FIG. 3B illustrate the nitride semiconductor device according to the first embodiment.

FIG. 3A is a cross-sectional TEM image of the nitride semiconductor device and the nitride semiconductor wafer. FIG. 3B is a schematic view drawn based on FIG. 3A. In FIG. 3B, the configurations of the first Si-containing layer 51s, the first GaN layer 51g, the second Si-containing layer 52s, and the second GaN layer 52g included in the stacked body 50 are drawn schematically. The configuration of the first Si-containing layer 51s and the configuration of the second Si-containing layer 52s are drawn by solid lines. Dislocations 80 in the region higher than the first Si-containing layer 51s are schematically drawn by dotted lines.

It can be seen from FIG. 3A and FIG. 3B that the dislocations 80 occur at the interface between the substrate 40 and the AlN buffer layer 62. The density of the dislocations 80 is extremely high inside the AlN buffer layer 62 and inside the AlGaN layer 51a. The dislocations 80 decrease drastically in the layers higher than the first Si-containing layer 51s. The density of the dislocations 80 is reduced by providing the first Si-containing layer 51s. The first Si-containing layer 51s has the effect of blocking the dislocations 80.

In the example, a portion of the second Si-containing layer 52s contacts the first Si-containing layer 51s. The total thickness of the Si-containing layers is thick in the region where the second Si-containing layer 52s contacts the first Si-containing layer 51s. In this region, it is considered that the blocking effect of the dislocations 80 is increased by the first Si-containing layer 51s and the second Si-containing layer 52s. Thereby, it is considered that the density of the dislocations 80 decreases further.

The density of the dislocations 80 inside the second GaN layer 52g also decreases. In other words, the density of the dislocations 80 decreases in the region between the first Si-containing layer 51s and the second GaN layer 52g (i.e., the region including the first GaN layer 51g and the second Si-containing layer 52s).

A portion of the dislocations 80 bends in the interior of the first GaN layer 51g. This is because the first GaN layer 51g grows three-dimensionally by the first GaN layer 51g being formed on the first Si-containing layer 51s. The propagation of the dislocations 80 in the stacking direction is suppressed by the bending of a portion of the dislocations 80.

The dislocations 80 also decrease at the oblique surface 51gs of the protrusion 51gp of the first GaN layer 51g. This phenomenon will now be described further.

FIG. 4A to FIG. 4D illustrate the nitride semiconductor device according to the first embodiment.

Figures 4A, 4C:
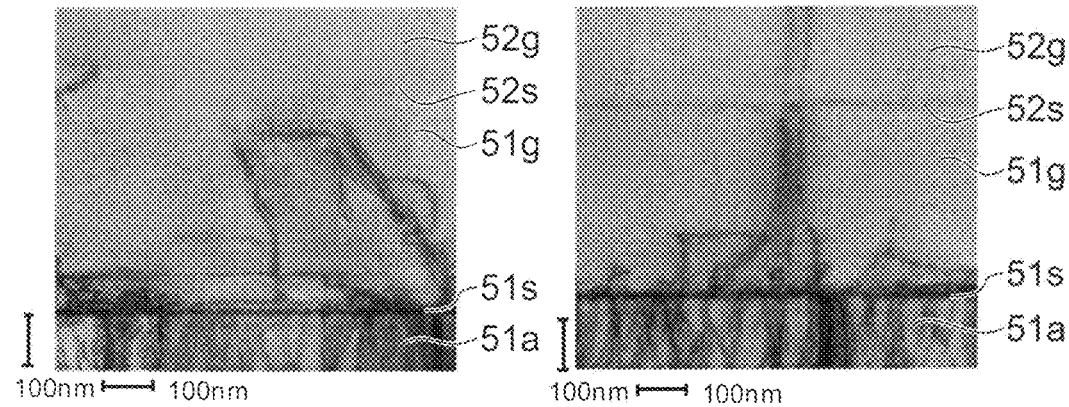
FIG. 4A to FIG. 4D show the nitride semiconductor device according to the first embodiment.
Figures 4B, 4D:
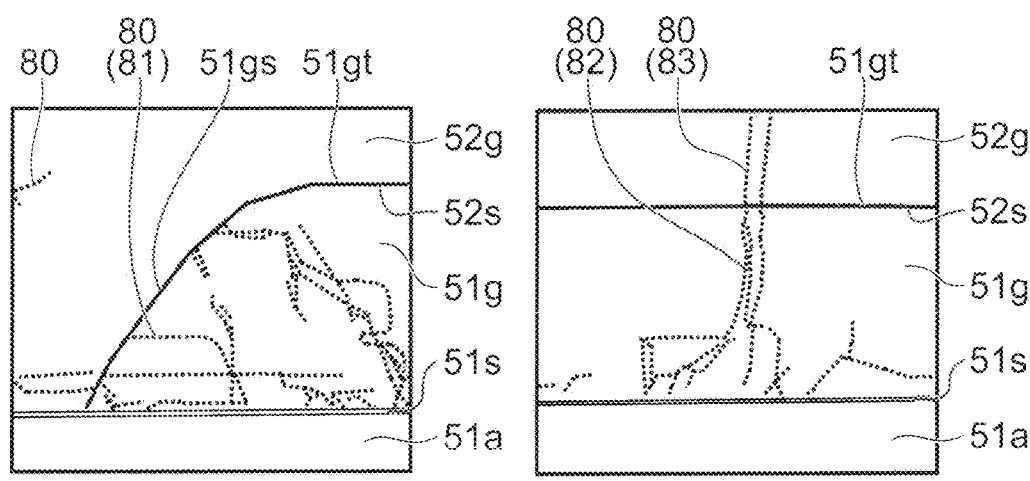

FIG. 4A and FIG. 4C are cross-sectional TEM images of the nitride semiconductor device and the nitride semiconductor wafer. FIG. 4A is an enlarged image of a portion of the oblique surface 51gs of the first GaN layer 51g. FIG. 4C is an enlarged image of a portion of the top surface 51gt of the first GaN layer 51g. FIG. 4B is a schematic view drawn based on FIG. 4A. FIG. 4D is a schematic view drawn based on FIG. 4C. In FIG. 4B and FIG. 4D, the configuration of the first Si-containing layer 51s and the configuration of the second Si-containing layer 52s are drawn by solid lines. The dislocations 80 in the region higher than the first Si-containing layer 51s are drawn schematically by dotted lines.

It can be seen from FIG. 4A and FIG. 4B that the dislocations 80 terminate at the second GaN layer 52g provided on the oblique surface 51gs of the protrusion 51gp of the first GaN layer 51g. Thus, the dislocations 80 decrease at the oblique surface 51gs. For example, the first GaN layer 51g has multiple first dislocations 81 communicating with the oblique surface 51gs inside the protrusion 51gp. The number of the dislocations 80 inside the second GaN layer 52g that are continuous with the first dislocations 81 via the second Si-containing layer 52s is less than the number of the multiple first dislocations 81. In the regions shown in FIG. 4A and FIG. 4B, the number of the dislocations 80 inside the second GaN layer 52g that are continuous with the first dislocations 81 via the second Si-containing layer 52s is observed to be 0. Conversely, the number of the first dislocations 81 communicating with the oblique surface 51gs inside the protrusion 51gp is large. Thus, the phenomenon of the dislocations 80 decreasing at the oblique surface 51gs is a phenomenon newly discovered by the inventor of the application.

On the other hand, as shown in FIG. 4C and FIG. 4D, the suppression effect of the dislocations 80 at the second GaN layer 52g provided on the top surface 51gt of the protrusion 51gp of the first GaN layer 51g is small. In the example, the dislocations 80 (the second dislocations 82) at the lower side of the top surface 51gt (the first GaN layer 51g) communicate with the dislocations 80 (the third dislocations 83) at the upper side of the top surface 51gt (the second GaN layer 52g). At the portion of the second Si-containing layer 52s positioned on the top surface 51gt, the change of the propagation of the dislocations 80 is small; and the dislocations 80 propagate from the first GaN layer 51g toward the second GaN layer 52g.

Thus, the reduction effect of the dislocations at the oblique surface 51gs is larger than the reduction effect of the dislocations at the top surface 51gt.

For example, in the case where the protrusion 51gp of the first GaN layer 51g has a top surface 51gt that is parallel to the upper surface 51au of the AlGaN layer 51a, the first GaN layer 51g has the first dislocations 81 (referring to FIG. 4B) and the second dislocations 82 (referring to FIG. 4D). The first dislocations 81 communicate with the oblique surface 51gs of the protrusion 51gp inside the protrusion 51gp. The second dislocations 82 communicate with the top surface 51gt inside the protrusion 51gp.

The second GaN layer 52g has the multiple third dislocations 83. A portion of the multiple third dislocations 83 is continuous from the second dislocations 82. The dislocations are taken to be continuous even in the case where the dislocations are continuous via a second Si-containing layer 52s that is thin. The ratio of the number (e.g., a positive integer N1 not less than 0) of the multiple third dislocations 83 continuous with the first dislocations 81 to the number (e.g., a positive integer N3) of the multiple third dislocations is taken as a first ratio (N1/N3). The ratio of the number (e.g., a positive integer N2) of the multiple third dislocations 83 continuous with the second dislocations 82 to the number (N3) of the multiple third dislocations is taken as a second ratio (N2/N3). The first ratio (N1/N3) is lower than the second ratio (N2/N3).

The number of the multiple first dislocations 81 inside the protrusion 51gp is taken as N01. The number of the multiple second dislocations 82 inside the protrusion 51g is taken as N02. For example, the ratio (N1/N01) of the number (N1) of the multiple third dislocations 83 continuous with the first dislocations 81 to the number (N01) of the multiple first dislocations is lower than the ratio (N2/N02) of the number (N2) of the multiple third dislocations 83 continuous with the second dislocations 82 to the number (N02) of the multiple second dislocations 82.

Thus, in the case where the protrusion 51gp that has the oblique surface 51gs is provided, the dislocations 80 propagating into the second GaN layer 52g can be reduced drastically by forming the second Si-containing layer 52s in contact with the oblique surface 51gs. Thereby, the dislocations 80 that reach the functional layer 15 can be reduced drastically.

FIG. 3A, FIG. 3B, and FIGS. 4A to 4D show characteristics of the nitride semiconductor wafer according to the embodiment. In the nitride semiconductor wafer according to the embodiment as well, the dislocations can be reduced similarly to the nitride semiconductor device.

According to the embodiment, a nitride semiconductor device and a nitride semiconductor wafer having few dislocations can be provided.

Experimental results of samples of nitride semiconductor devices (or nitride semiconductor wafers) having various configurations will now be described.

FIG. 5A FIG. 5F are schematic cross-sectional views illustrating the samples.

As shown in FIG. 5A, the AlGaN layer 51a, the first Si-containing layer 51s, the first GaN layer 51g, the second Si-containing layer 52s, and the second GaN layer 52g recited above are provided in a first sample 151. The first GaN layer 51g is provided on a portion of the first Si-containing layer 51s; and a portion of the second Si-containing layer 52s contacts the first Si-containing layer 51s. The first GaN layer 51g includes the protrusion 51gp that has the oblique surface 51gs. The first sample 151 corresponds to the nitride semiconductor device 110 or the nitride semiconductor wafer 210 recited above. The method for manufacturing the first sample 151 is the same as the manufacturing method described in regard to the nitride semiconductor device 110.

As shown in FIG. 5B, the AlGaN layer 51a, the first Si-containing layer 51s, the first GaN layer 51g, the second Si-containing layer 52s, and the second GaN layer 52g are provided also in a second sample 152. In the second sample 152, the first GaN layer 51g is provided on the entire surface of the first Si-containing layer 51s. The second Si-containing layer 52s does not contact the first Si-containing layer 51s. The first GaN layer 51g includes the protrusion 51gp that has the oblique surface 51gs. The first GaN layer 51g is continuous. A portion of the method for manufacturing the second sample 152 is different from the method for manufacturing the first sample 151. When forming the first GaN layer 51g of the second sample 152, TMGa and ammonia are supplied for 2.5 minutes at flow rates of 112 cc/min and 40 L/min, respectively. In other words, the growth rate of the first GaN layer 51g of the second sample 152 is twice the growth rate of the first GaN layer 51g of the first sample 151. Otherwise, the conditions are the same as those of the first sample 151.

As shown in FIG. 5C, the AlGaN layer 51a, the first Si-containing layer 51s, the first GaN layer 51g, the second Si-containing layer 52s, and the second GaN layer 52g are provided also in a third sample 153. The first GaN layer 51g of the third sample 153 does not include the protrusion 51gp. The first GaN layer 51g is flat. The thickness of the first GaN layer 51g is about 600 nm. The second Si-containing layer 52s also is flat. The growth time of the first GaN layer 51g when constructing the third sample 153 is 15 minutes. Otherwise, the conditions are the same as those of the first sample 151.

As shown in FIG. 5D, the AlGaN layer 51a, the first GaN layer 51g, the second Si-containing layer 52s, and the second GaN layer 52g are provided in a fourth sample 154. The first Si-containing layer 51s is not provided in the fourth sample 154. The first GaN layer 51g includes the protrusion 51gp that has the oblique surface 51gs. The first GaN layer is continuous. The supply amount of the ammonia when forming the first GaN layer 51g of the fourth sample 154 is 2.5 L/min. In other words, the V/III ratio when forming the first GaN layer 51g of the fourth sample 154 is ⅟₁₆ of that of the first sample 151. Otherwise, the conditions are the same as those of the first sample 151.

As shown in FIG. 5E, the AlGaN layer 51a, the first GaN layer 51g, the second Si-containing layer 52s, and the second GaN layer 52g are provided in a fifth sample 155. The first Si-containing layer 51s is not provided in the fifth sample 155. The first GaN layer 51g does not include the protrusion 51gp; and the first GaN layer 51g is flat. The fifth sample 155 corresponds to the configuration of the third sample 153 without the first Si-containing layer 51s being provided.

As shown in FIG. 5F, the AlGaN layer 51a, the second Si-containing layer 52s, and the second GaN layer 52g are provided in a sixth sample 156. The first Si-containing layer 51s and the first GaN layer 51g of the third sample 153 are not provided in the sixth sample 156.

FIG. 6A to FIG. 6F are scanning electron microscope images of the cross sections of the samples.

FIG. 6A to FIG. 6F show cross-sectional SEM images of the first to sixth samples 151 to 156, respectively.

Figure 6A:
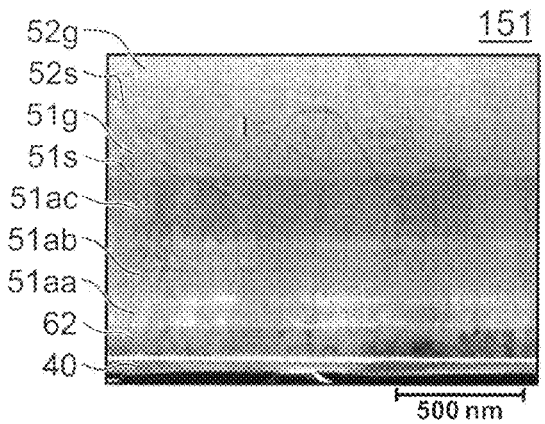
FIG. 6A to FIG. 6F are scanning electron microscope images of the cross sections of the samples.

It can be seen from FIG. 6A that the first GaN layer 51g of the first sample 151 includes the protrusion 51gp that has the oblique surface 51gs. A portion of the second Si-containing layer 52s contacts the first Si-containing layer 51s in the region between the protrusions 51gp. The height of the unevenness of the first GaN layer 51g (the height tg1 of the protrusion 51gp) is about 400 nm.

Figure 6B:
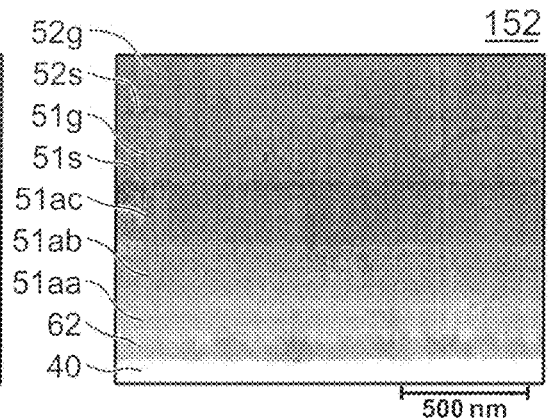

It can be seen from FIG. 6B that although the protrusion 51gp is provided in the first GaN layer 51g of the second sample 152, the first GaN layer 51g is a continuous crystal. The second Si-containing layer 52s does not contact the first Si-containing layer 51s. The height of the protrusion 51gp (the height of the unevenness) of the first GaN layer 51g is about 300 nm. The height of the unevenness of the first GaN layer 51g of the second sample 152 is less than the height of the unevenness of the first GaN layer 51g of the first sample 151 (the nitride semiconductor device 110). The density of the crystal of the first GaN layer 51g of the second sample 152 is high; and the first GaN layer 51g is a continuous crystal. The height of the unevenness decreases and the density of the crystal increases as the growth rate of the GaN layer is increased.

Figure 6C:
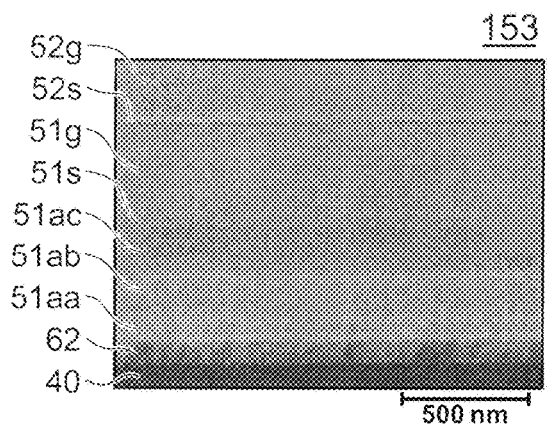

It can be seen from FIG. 6C that protrusions are not provided in the first GaN layer 51g of the third sample 153. The first GaN layer 51g is a flat film.

Figure 6D:
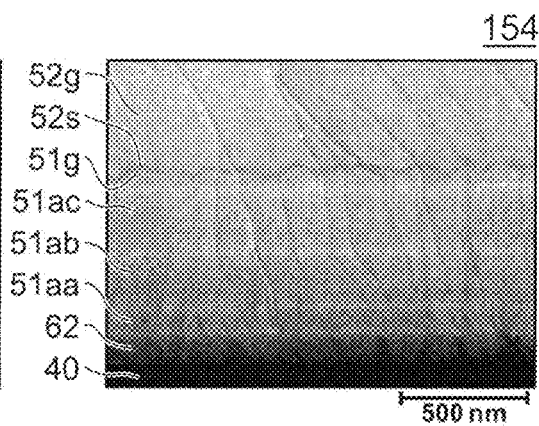

It can be seen from FIG. 6D that the first Si-containing layer 51s is not provided in the fourth sample 154. The first GaN layer 51g includes the protrusion 51gp that has the oblique surface 51gs. The first GaN layer 51g is continuous.

Figure 6E:
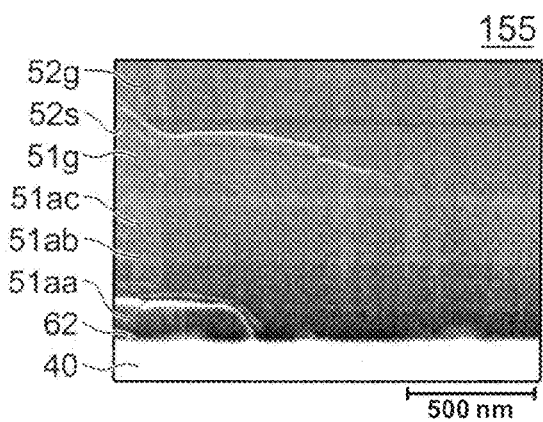

It can be seen from FIG. 6E that the first Si-containing layer 51s is not provided in the fifth sample 155. Further, the first GaN layer 51g is flat.

Figure 6F:
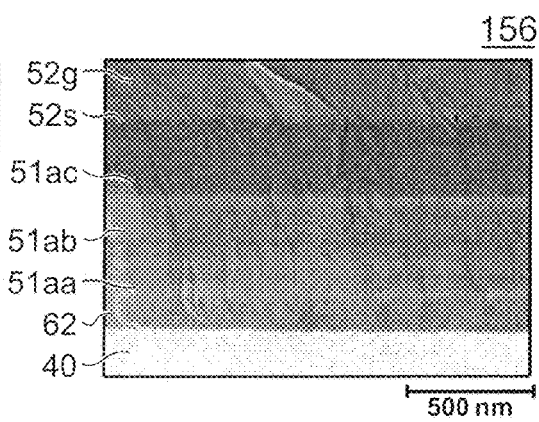

It can be seen from FIG. 6F that the first Si-containing layer 51s and the first GaN layer 51g are not provided in the sixth sample 156.

Figure 7:
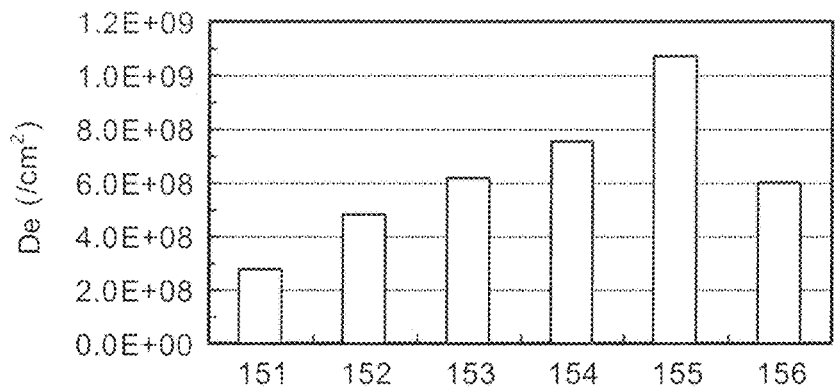
FIG. 7 is a graph showing measurement results of the dislocation density of the samples.

FIG. 7 is a graph illustrating measurement results of the dislocation density of the samples.

FIG. 7 shows the measurement results of the dislocation density (the edge dislocation density) of the first to sixth samples 151 to 156. The vertical axis represents an edge dislocation density De. The edge dislocation density De is derived from the rocking curve width at half maximum of X-ray diffraction measurements.

In the first sample 151 as shown in FIG. 7, the edge dislocation density De is $2.8 \times 10^8$ (/cm$^2$); and the dislocation density is low. The edge dislocation density De of the first sample 151 corresponds to the edge dislocation density of the nitride semiconductor device 110 or the nitride semiconductor wafer 210. In the first sample 151, it is considered that the edge dislocation density De decreases due to the following.

The first GaN layer 51g grows three-dimensionally and can bend the dislocations 80 occurring at the buffer layer 60 toward a direction parallel to the stacking direction (the Z-axis direction) inside the first GaN layer 51g. Thereby, the dislocations 80 that reach the upper layer (the functional layer 15) can be reduced.

The dislocations 80 occurring at the buffer layer 60 in the region (the region between the protrusions 51gp) where the growth of the first GaN layer 51g is suppressed by the first Si-containing layer 51s are blocked by the first Si-containing layer 51s. Thereby, the propagation of the dislocations 80 into the upper layer is suppressed; and the dislocations 80 can be reduced.

Further, the number of the dislocations 80 propagating to the upper layer side at the oblique surface 51gs of the protrusion 51gp of the first GaN layer 51g decreases. The dislocations 80 bend at the oblique surface 51gs. In other words, the dislocations 80 bend at the second Si-containing layer 52s provided on the oblique surface 51gs. The propagation of the dislocations 80 is blocked at the oblique surface 51gs. As a result, the dislocations 80 that reach the upper layer can be drastically reduced.

In the second sample 152 as shown in FIG. 7, the edge dislocation density De is $4.8 \times 10^8$ (/cm$^2$); and the dislocation density is low. The edge dislocation density De of the first sample 151 is lower than the edge dislocation density De of the second sample 152. In the second sample 152, the second Si-containing layer 52s does not contact the first Si-containing layer 51s. Therefore, it is considered that the blocking effect of the dislocations 80 that propagate from the AlGaN layer 51a is small in the second sample 152. The edge dislocation density De of a configuration (e.g., the first sample 151) in which the second Si-containing layer 52s contacts the first Si-containing layer 51s can be reduced to about 60% of a configuration (e.g., the second sample 152) in which the second Si-containing layer 52s does not contact the first Si-containing layer 51s.

It can be seen from FIG. 7 that the edge dislocation density De of the third sample 153 is $6.2 \times 10^8$ (/cm$^2$) and the dislocation density is high. In the third sample 153, the protrusion 51gp is not provided in the first GaN layer 51g. Therefore, the bending effect or the blocking effect of the dislocations 80 is not obtained at the oblique surface 51gs of the protrusion 51gp. Further, the second Si-containing layer 52s does not contact the first Si-containing layer 51s. Therefore, the blocking effect of the dislocations 80 is small. It is considered that the edge dislocation density De is high in the third sample 153 due to the reasons recited above.

It can be seen from FIG. 7 that the edge dislocation density De is $7.5 \times 10^8$ (/cm$^2$) and the dislocation density is high in the fourth sample 154. Because the first Si-containing layer 51s is not provided in the fourth sample 154, the blocking effect of the dislocations 80 by the first Si-containing layer 51s is not obtained. The edge dislocation density De of the fourth sample 154 is about 1.6 times the edge dislocation density De of the second sample 152. In other words, the edge dislocation density De of a configuration (e.g., the second sample 152) in which the first Si-containing layer 51s is provided can be reduced to about 64% of a configuration (e.g., the fourth sample 154) in which the first Si-containing layer 51s is not provided.

It can be seen from FIG. 7 that the edge dislocation density De is $1.1 \times 10^9$ (/cm$^2$) and the dislocation density is high in the fifth sample 155. The first Si-containing layer 51s is not provided in the fifth sample 155. Therefore, the blocking effect of the dislocations 80 by the first Si-containing layer 51s is not obtained. Further, in the fifth sample 155, the protrusion 51gp is not provided in the first GaN layer 51g. Therefore, the bending effect or the blocking effect of the dislocations 80 by the oblique surface 51gs (or the second Si-containing layer 52s provided on the oblique surface 51gs) of the protrusion 51gp is not obtained. Therefore, it is considered that the edge dislocation density De is high in the fifth sample 155. The edge dislocation density De of the fifth sample 155 is about 1.7 times that of the fourth sample 154. In other words, the edge dislocation density De of a configuration (e.g., the fourth sample 154) in which the first GaN layer 51g includes the protrusion 51gp that has the oblique surface 51gs can be reduced to about 70% of a configuration (e.g., the fifth sample 155) in which the first GaN layer 51g is flat.

It can be seen from FIG. 7 that the edge dislocation density De is $6.0 \times 10^8$ (/cm$^2$) and the dislocation density is high in the sixth sample 156. The first GaN layer 51g and the second Si-containing layer 52s are not provided in the sixth sample 156. Therefore, the bending effect or the blocking effect of the dislocations 80 by the oblique surface 51gs (or the second Si-containing layer 52s provided on the oblique surface 51gs) of the protrusion 51gp of the first GaN layer 51g is not obtained. The Si-containing layer is one layer; and the blocking effect of the dislocations 80 by the second Si-containing layer 52s contacting the first Si-containing layer 51s is not increased. It is considered that the edge dislocation density De of the sixth sample 156 is high due to the reasons recited above.

Thus, the dislocation density can be reduced by providing the AlGaN layer 51a, the first Si-containing layer 51s, the first GaN layer 51g including the protrusion 51gp that has the oblique surface 51gs, the second Si-containing layer 52s, and the second GaN layer 52g in the stacked body 50. A nitride semiconductor device and a nitride semiconductor wafer having few dislocations are obtained.

The dislocations can be reduced by the configurations of the first sample 151 and the second sample 152. As in the first sample 151, the reduction effect of the dislocation density is high in a configuration in which the first GaN layer 51g is provided on a portion of the first Si-containing layer 51s and a portion of the second Si-containing layer 52s contacts the first Si-containing layer 51s.

Figures 8A, 8B:
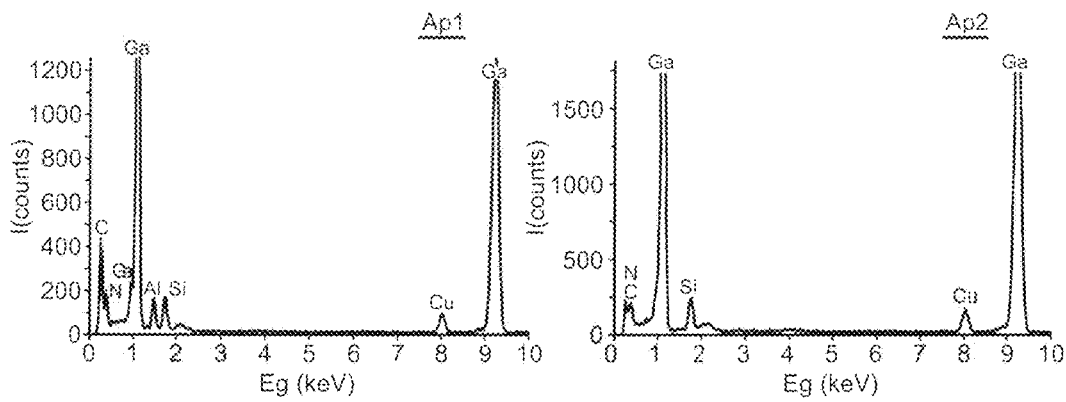
FIG. 8A to FIG. 8C are schematic views showing the nitride semiconductor device according to the embodiment.
Figure 8C:
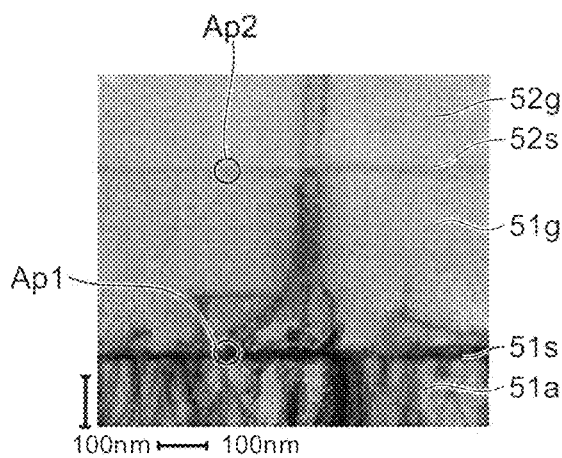

FIG. 8A to FIG. 8C are schematic views illustrating the nitride semiconductor device according to the embodiment.

FIG. 8A and FIG. 8B are graphs showing examples of results of energy dispersive X-ray spectrometry (EDS analysis) of the nitride semiconductor device 110 (or the nitride semiconductor wafer 210) according to the embodiment. FIG. 8C shows the analysis locations of the EDS analysis. FIG. 8C shows a first analysis position Ap1 and a second analysis position Ap2 as the EDS analysis locations in the cross-sectional TEM image of FIG. 4C. The first analysis position Ap1 corresponds to the position of the first Si-containing layer 51s. The second analysis position Ap2 corresponds to the position of the second Si-containing layer 52s.

FIG. 8A corresponds to the analysis result of the first analysis position Ap1. FIG. 8B corresponds to the analysis result of the second analysis position Ap2. In FIG. 8A and FIG. 8B, the horizontal axis represents energy Eg (keV (kilo electron volts)). The vertical axis represents an intensity I (counts). The detection limit of Si of the EDS analysis is 1000 ppm.

In the example, a growth time TMs1 of the first Si-containing layer 51s is 8 minutes. This condition corresponds to the condition at which the Si surface density of the first Si-containing layer 51s is $1.2 \times 10^{15}/cm^2$. A growth time TMs2 of the second Si-containing layer 52s is 3 minutes. This condition corresponds to the condition at which the Si surface density of the second Si-containing layer 52s is $3.8 \times 10^{14}/cm^2$.

It can be seen from FIG. 8A and FIG. 8B that Si is detected at the first Si-containing layer 51s and the second Si-containing layer 52s in the embodiment. The Si concentration of the first Si-containing layer 51s can be estimated to be about 4.5 (atomic %). The Si concentration of the second Si-containing layer 52s can be estimated to be about 3.9 (atomic %). Thus, in the embodiment, the Si concentration of the Si-containing layer is not less than the detection limit (1000 ppm). A large effect of the dislocation reduction is obtained by the Si concentration being set to be not less than 1000 ppm.

There is a method for growing a Group III nitride semiconductor in which the crystal nuclei of the Group III nitride semiconductor are formed in an island configuration; subsequently, a silicon source gas and a Group III source gas are alternately supplied while supplying a nitrogen source gas to grow the crystal nuclei in the island configuration; and the Group III nitride semiconductor is grown from each of the crystal nuclei of the island configuration by further supplying the nitrogen source gas and the Group III source gas. In this method, the dislocation density in the upper layer is reduced by growing the Group III nitride semiconductor from the crystal nuclei in the lateral direction, causing the dislocations to collect at the junction portions where the crystals growing from mutually-adjacent crystal nuclei join, and utilizing the difference of the thicknesses of the crystal nuclei to confine the dislocations. In other words, the dislocations between the crystal nuclei are reduced. For this method, in EDS analysis having a detection limit of Si of 1000 ppm, Si is substantially not detected at the buffer layer or crystal nuclei.

Conversely, in the nitride semiconductor device and the nitride semiconductor wafer according to the embodiment, the dislocations 80 inside the protrusion 51gp of the first GaN layer 51g are reduced at the second Si-containing layer 52s provided on the oblique surface 51gs of the protrusion 51gp. In the embodiment as described above, the Si concentration of the Si-containing layer is sufficiently caused to be the detection limit or more. The Si concentration of the first Si-containing layer 51s is, for example, not less than $7 \times 10^{19}/cm^3$ and not more than $4 \times 10^{20}/cm^3$.

An example of the configuration according to the embodiment will now be described.

The buffer layer 60 includes, for example, the AlN buffer layer 62. The thickness of the AlN buffer layer 62 is, for example, about 100 nm (e.g., not less than 10 nm and not more than 400 nm). A GaN layer may be used as the buffer layer 60. In the case where the GaN layer is used as the buffer layer 60, the thickness of the GaN layer is about 30 nm (e.g., not less than 20 nm and not more than 50 nm). The buffer layer 60 may include AlGaN, InGaN, or a mixed crystal such as AlInN, etc.

In the case where a silicon substrate is used as the substrate 40, it is easy to suppress meltback etching that occurs due to the reaction between silicon and gallium by using AlN, for which chemical reactions with silicon do not occur easily, as the buffer layer 60 that contacts the silicon. In the case where the buffer layer 60 includes In, lattice mismatch with the silicon substrate is suppressed; and it becomes easier to suppress the dislocations. In the case where the buffer layer 60 includes In, a desorption reaction of the In occurs easily in the crystal growth. Therefore, to obtain a buffer layer 60 that has good flatness, it is favorable for the In composition ratio to be not more than 0.5.

The suppression effect of the meltback etching can be increased by providing the AlGaN layer 51a in the stacked body 50. Compressive stress occurs in the AlGaN layer 51a; and less tensile stress occurs due to the difference between the coefficients of thermal expansion of the nitride semiconductor and the silicon substrate in the cooling process after the crystal growth. Thereby, the occurrence of cracks can be suppressed.

As described above, the AlGaN layer 51a may include multiple layers (e.g., the first to third AlGaN layers 51aa, 51ab, and 51ac, etc.). Thereby, the compressive stress occurring in the AlGaN layer 51a can be increased. In the case where the AlGaN layer 51a includes multiple layers, it is favorable for the Al composition ratio to decrease upward.

For example, in the case where AlN is used as the buffer layer 60, the Al composition ratio of the multiple AlGaN layers provided in the AlGaN layer 51a are set such that, for example, the difference between the lattice constants of the AlN and the GaN is subdivided over the number of stacks at a uniform spacing. The lattice mismatch between AlN and GaN at room temperature is about 2.1%.

For example, in the case where three AlGaN layers are provided in the AlGaN layer 51a, the lattice constant difference between the AlGaN layers is set to be about 0.7%. For example, the Al composition ratio of the first AlGaN layer 51aa is about 0.55. The Al composition ratio of the second AlGaN layer 51ab is, for example, 0.3. The Al composition ratio of the third AlGaN layer 51ac is, for example, 0.15.

For example, in the case where two AlGaN layers are provided in the AlGaN layer 51a, the lattice constant difference between the AlGaN layers is set to be about 1.0%. For example, the Al composition ratio of the first AlGaN layer 51aa is about 0.5. The Al composition ratio of the second AlGaN layer 51ab is, for example, 0.2.

The difference between the Al composition ratios of the AlGaN layers is not constant. This is because strain occurs in the AlGaN layers. The lattice mismatch of the AlGaN layers at room temperature is calculated by, for example, X-ray diffraction measurements.

At least one selected from the first Si-containing layer 51s and the second Si-containing layer 52s may include a SiN layer. At least one selected from the first Si-containing layer 51s and the second Si-containing layer 52s may be a layer (a δ doping layer) in which a portion of the GaN is doped with Si at a high concentration.

By providing the first Si-containing layer 51s, the first GaN layer 51g grows three-dimensionally when forming the first GaN layer 51g on the first Si-containing layer 51s. The Si concentration and/or the thickness of the first Si-containing layer 51s fluctuate in the plane (the X-Y plane) perpendicular to the stacking direction. For example, the first GaN layer 51g selectively grows easily in portions having a low Si concentration or portions that are thin. Thereby, the first GaN layer 51g grows three-dimensionally.

Because the first GaN layer 51g grows three-dimensionally, the dislocations 80 occurring at the buffer layer 60 bend toward a direction parallel to the stacking direction (the Z-axis direction). Thereby, the number of the dislocations 80 that reach the upper layer (the functional layer 15) can be reduced.

The dislocations 80 occurring at the buffer layer 60 in the region (the region of the first GaN layer 51g between the protrusions 51gp) where the growth of the first GaN layer 51g is suppressed by the first Si-containing layer 51s are blocked by the first Si-containing layer 51s. Thereby, the propagation of the dislocations 80 into the upper layer is suppressed. In the case where the coverage of the first Si-containing layer 51s is high, the reduction effect of the dislocations 80 increases.

The first Si-containing layer 51s contacts the AlGaN layer 51a. The AlGaN layer 51a and the first GaN layer 51g are proximal to each other with the first Si-containing layer 51s interposed. Thereby, the first GaN layer 51g grows while being affected by the lattice mismatch difference with the AlGaN layer 51a. By providing the lattice mismatch difference, the first GaN layer 51g grows more easily three-dimensionally; and the dislocation reduction effect increases. Also, the dislocations occurring in the portion where the AlGaN layer 51a and the first GaN layer 51g are proximal to each other with the first Si-containing layer 51s interposed can be reduced.

The thickness of the first Si-containing layer 51s is not less than 0.4 atomic layers thick and not more than 2 atomic layers thick and is, for example, 1 atomic layer thick. In the case where the thickness of the first Si-containing layer 51s is thinner than 0.4 atomic layers thick, the three-dimensional growth of the first GaN layer 51g does not occur easily; and the reduction effect of the dislocations 80 decreases. In the case where the thickness of the first Si-containing layer 51s is thicker than 2 atomic layers thick, the growth of the first GaN layer 51g becomes difficult.

The thickness of the first Si-containing layer 51s can be estimated by direct observation using transmission electron microscope images or by secondary ion mass spectroscopy (SIMS). In the case of SIMS analysis, the case where the Si concentration inside the layer is about $2 \times 10^{20}/cm^3$ corresponds to being 1 atomic layer thick. When converted to surface density, this Si concentration corresponds to a Si surface density of about $1 \times 10^{15}/cm^2$.

The second Si-containing layer 52s is provided on the first GaN layer 51g. The first GaN layer 51g includes the protrusion 51gp. The protrusion 51gp has the oblique surface 51gs that is tilted with respect to the plane (the X-Y plane) perpendicular to the stacking direction (the Z-axis direction). The oblique surface 51gs is, for example, a facet surface such as a (10-11) plane, a (11-22) plane, etc. The oblique surface 51gs may not be a designated crystal plane. The angle between the X-Y plane and the oblique surface 51gs of the protrusion 51gp may change. The protrusion 51gp may have a conic configuration or a dome configuration.

A portion of the first Si-containing layer 51s is exposed between the protrusions 51gp included in the first GaN layer 51g. The second Si-containing layer 52s is formed on the first Si-containing layer 51s that is exposed and on the first GaN layer 51g (on the oblique surface 51gs of the protrusion 51gp and on the upper surface (the top surface 51gt) of the protrusion 51gp). By forming the second Si-containing layer 52s on the oblique surface 51gs of the first GaN layer 51g, the dislocations 80 are caused to bend at the interface between the oblique surface 51gs and the second Si-containing layer 52s; and the dislocations 80 propagating into the functional layer 15 can be reduced.

In the case where a portion of the second Si-containing layer 52s contacts the first Si-containing layer 51s, the blocking effect of the dislocations 80 by the Si-containing layer increases. Thereby, the suppression effect of the propagation of the dislocations 80 occurring at the buffer layer 60 into the upper layer (the functional layer 15) increases.

It is favorable for the thickness of the second Si-containing layer 52s to be not less than 0.2 atomic layers thick and not more than 2 atomic layers thick (e.g., 0.5 atomic layers thick). In the case where the thickness of the second Si-containing layer 52s is thinner than 0.2 atomic layers thick, the bending effect or the blocking effect of the dislocations 80 at the oblique surface 51gs is not sufficiently obtained; and the reduction effect of the dislocation density decreases. In the case where the thickness of the second Si-containing layer 52s is thicker than 2 atomic layers thick, the second GaN layer 52g does not grow easily. As a result, planarizing at the second GaN layer 52g becomes difficult.

It is favorable for the thickness of the second Si-containing layer 52s to be thinner than the thickness of the first Si-containing layer 51s. In the case where the thickness of the second Si-containing layer 52s is thicker than the thickness of the first Si-containing layer 51s, a high density unevenness is formed on the oblique surface 51gs of the protrusion 51gp of the first GaN layer 51g; and the surface flatness decreases. Therefore, the characteristics of the functional layer 15 easily degrade.

It is favorable for the sum of the thickness of the first Si-containing layer 51s and the thickness of the second Si-containing layer 52s to be not less than 0.7 atomic layers thick and not more than 2 atomic layers thick. In the case where the sum of the thicknesses is thinner than 0.7 atomic layers thick, the bending effect or the blocking effect of the dislocations 80 by the Si-containing layer becomes difficult to obtain. In the case where the sum of the thicknesses is thicker than 2 atomic layers thick, the unevenness formation at the GaN layer becomes excessive; and the flatness degrades. Further, in the case where the sum of the thicknesses is thicker than 2 atomic layers thick, cracks occur easily due to the occurrence of tensile stress inside the GaN layer due to the unevenness formation.

By the second GaN layer 52g of a sufficient thickness being formed on the second Si-containing layer 52s, the upper surface of the second GaN layer 52g becomes flat. Then, the major surface of the functional layer 15 formed on the second GaN layer 52g becomes flat.

Figure 9A:
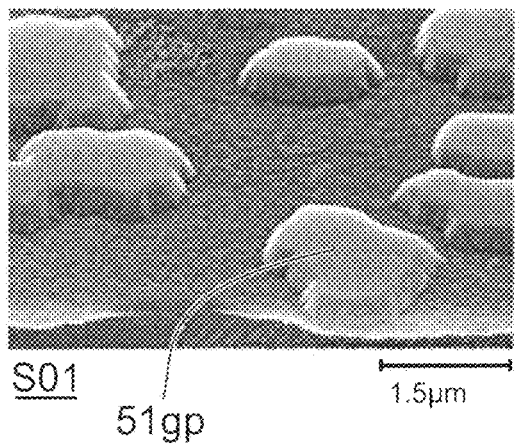
FIG. 9A to FIG. 9C are electron microscope photographs showing the nitride semiconductor device according to the embodiment.
Figure 9B:
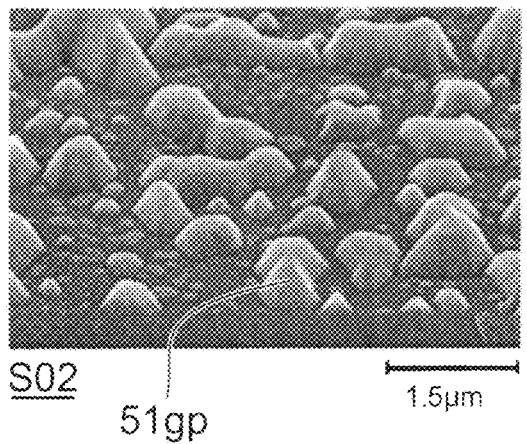
Figure 9C:
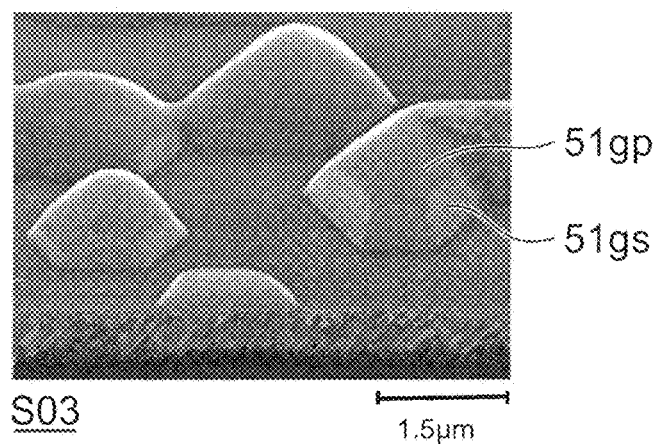

FIG. 9A to FIG. 9C are electron microscope photographs illustrating the nitride semiconductor device according to the embodiment.

These drawings are SEM images of three samples in which the first GaN layer 51g is formed on the first Si-containing layer 51s. These drawings show the configurations of the first GaN layer 51g. The formation conditions of the layers are different between these samples. These drawings also show examples of nitride semiconductor wafers.

In a first example S01 shown in FIG. 9A, the first Si-containing layer 51s is formed on the AlGaN layer 51a by supplying silane ($SiH_4$) having a concentration of 10 ppm and ammonia for 3 minutes at flow rates of 350 cc/min and 20 L/min, respectively, at a substrate temperature of 1040° C. Subsequently, the first GaN layer 51g is formed by supplying TMGa and ammonia for 5 minutes at flow rates of 56 cc/min and 40 L/min, respectively, at a substrate temperature of 1090° C. The flow rate of the TMGa of 56 cc/min corresponds to 273 μmol/min. Accordingly, the V/III ratio of the first example S01 when forming the first GaN layer 51g is 6500. The thickness of the first Si-containing layer 51s is about 0.4 atomic layers thick.

In a second example S02 shown in FIG. 9B, the growth time when forming the first Si-containing layer 51s is 8 minutes. Otherwise, the second example S02 is the same as the first example S01. In the second example S02, the thickness of the first Si-containing layer 51s is about 1 atomic layer thick.

In a third example S03 shown in FIG. 9C, the ammonia flow rate when forming the first GaN layer 51g is 2.5 L/min. Otherwise, the third example S03 is the same as the first example S01. In the third example S03, the V/III ratio when forming the first GaN layer 51g is the low value of 490.

It can be seen from FIG. 9A that the first GaN layer 51g is a crystal having an island configuration in the first example S01. The height tg1 of the protrusion 51gp of the first GaN layer 51g is 150 nm to 200 nm. The diameter (the width, i.e., the length in a direction parallel to the X-Y plane) of the protrusion 51gp of the first GaN layer 51g is about 1.5 μm. In the first example S01, multiple microcrystals having heights that are not more than 50 nm are observed.

It can be seen from FIG. 9B that the height tg1 of the first GaN layer 51g increases to 200 nm to 500 nm in the second example S02 (in which the formation time of the first Si-containing layer 51s is long, i.e., 8 minutes). On the other hand, the diameter (the width) of the protrusion 51gp of the first GaN layer 51g decreases to about 0.8 μm. In the second example S02, the microcrystals (the microcrystals having heights that are not more than 50 nm) recited above are substantially not observed.

Thus, the height tg1 and the diameter (the width) of the protrusion 51gp of the first GaN layer 51g can be changed by the thickness of the first Si-containing layer 51s. The height tg1 of the protrusion 51gp of the first GaN layer 51g increases in the case where the growth time of the Si-containing layer 51s is long, i.e., the case where the thickness of the first Si-containing layer 51s is thick.

It can be seen from FIG. 9C that in the case of the third example S03 (in which the V/III ratio when forming the first GaN layer 51g is the low value of 490), the height tg1 of the protrusion 51gp of the first GaN layer 51g increases to 400 nm to 700 nm. The surface area of the oblique surface 51gs increases. The protrusion 51gp has a conic configuration or a dome configuration. On the other hand, the diameter (the width) of the protrusion 51gp of the first GaN layer 51g is about 1.5 μm and is substantially similar to the first example S01.

Thus, the protrusion 51gp height tg1 and the configuration of the oblique surface 51gs of the first GaN layer 51g can be changed by the V/III ratio when forming the first GaN layer 51g. The height tg1 increases in the case where the V/III ratio is low. In the case where the V/III ratio is low, the proportion of the oblique surface 51gs to the entire protrusion 51gp increases.

FIG. 10A to FIG. 10D are graphs illustrating characteristics of the nitride semiconductor device. These drawings show examples of the height tg1 of the protrusion 51gp of the first GaN layer 51g when changing the growth time (the thickness) of the first Si-containing layer 51s and the V/III ratio, growth temperature, and growth rate when forming the first GaN layer 51g. These drawings also show examples of the characteristics of the nitride semiconductor wafer.

In these examples, the conditions relating to the first Si-containing layer 51s and the first GaN layer 51g that are not described below are the same as the conditions described in regard to FIG. 9A.

Figure 10A:
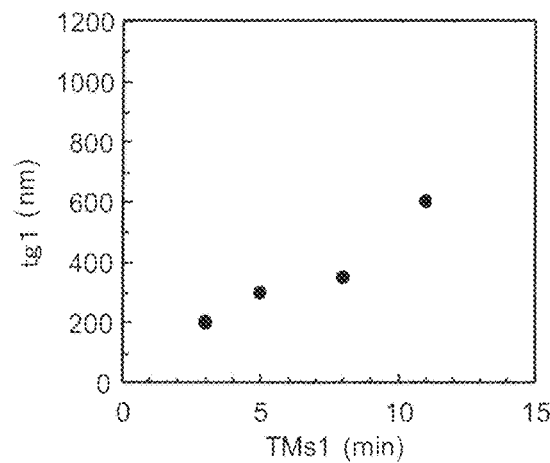
FIG. 10A to FIG. 10D are graphs showing characteristics of the nitride semiconductor device.
Figure 10B:
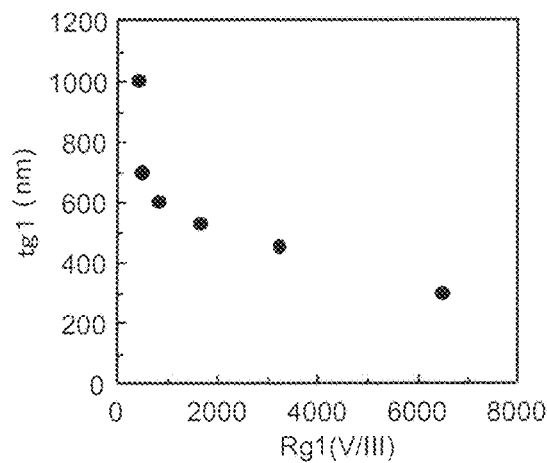
Figure 10C:
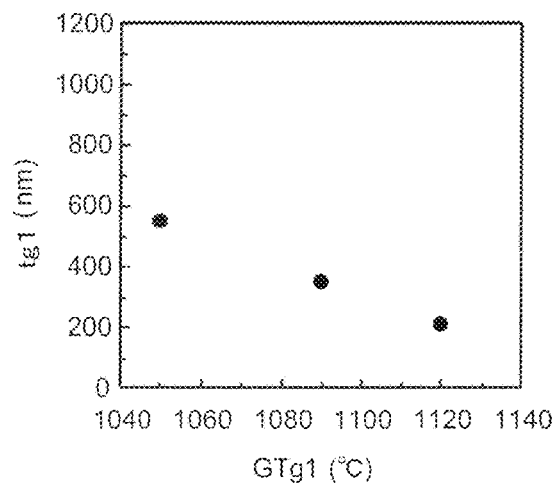
Figure 10D:
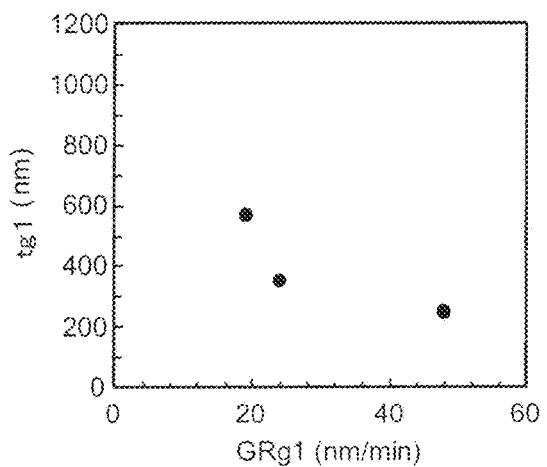

In these drawings, the vertical axis represents the height tg1 of the protrusion 51gp of the first GaN layer 51g. The horizontal axis of FIG. 10A represents the growth time TMs1 (minutes) of the first Si-containing layer 51s. The horizontal axis of FIG. 10B represents Rg1(V/III) which is the V/III ratio when forming the first GaN layer 51g. The horizontal axis of FIG. 10C represents a growth temperature GTg1 (° C.) when forming the first GaN layer 51g. The horizontal axis of FIG. 10D represents a growth rate GRg1 (nm/min) when forming the first GaN layer 51g.

As shown in FIG. 10A, the height tg1 of the protrusion 51gp of the first GaN layer 51g increases as the growth time TMs1 of the first Si-containing layer 51s. For example, in the case where the growth time TMs1 of the first Si-containing layer 51s is 5 minutes, the height tg1 is 300 nm. In the case where the growth time TMs1 is 11 minutes, the height tg1 is 600 nm.

FIG. 10B shows the change of the height tg1 of the protrusion 51gp of the first GaN layer 51g as the V/III ratio when forming the first GaN layer 51g changes. In the experiment, the supply amount of TMGa which is the Group III source-material gas is set to be constant at 56 cc/min; and the supply amount of the ammonia is changed.

As shown in FIG. 10B, in the case where the V/III ratio (Rg1(V/III)) when forming the first GaN layer 51g is low, the height tg1 of the protrusion 51gp of the first GaN layer 51g increases. In the case where the V/III ratio is 3250, the height tg1 is 450 nm. In the case where the V/III ratio is 410, the height tg1 is 1000 nm.

As shown in FIG. 10C, in the case where the growth temperature GTg1 (the substrate temperature) when forming the first GaN layer 51g is low, the height tg1 of the protrusion 51gp of the first GaN layer 51g increases. For example, in the case where the growth temperature GTg1 when forming the first GaN layer 51g is 1050° C., the height tg1 is 550 nm. In the case where the growth temperature GTg1 is 1120° C., the height tg1 is 210 nm. In the case where the growth temperature GTg1 of the first GaN layer 51g is higher than 1120° C., meltback etching occurs easily; and the crystal degrades easily. In the case where the growth temperature GTg1 of the first GaN layer 51g is lower than 1000° C., pits occur easily; and the crystal degrades easily. It is favorable for the growth temperature GTg1 of the first GaN layer 51g to be not less than 1000° C. and not more than 1120° C.

FIG. 10D shows the change of the height tg1 of the protrusion 51gp of the first GaN layer 51g as the growth rate GRg1 when forming the first GaN layer 51g changes. In the experiment, the supply amount of TMGa is changed. In such a case, the growth time is changed such that the total supply amount of the source-material gas when forming the first GaN layer 51g is constant. For example, in the case where the flow rate of the TMGa is doubled to be 112 cc/min, the growth time is halved to be 2.5 minutes.

As shown in FIG. 10D, the height tg1 of the protrusion 51gp of the first GaN layer 51g increases as the growth rate GRg1 of the first GaN layer 51g decreases (is slow). For example, in the case where the growth rate GRg1 of the first GaN layer 51g is 19 nm/min, the height tg1 is 550 nm. In the case where the growth rate GRg1 is 48 nm/min, the height tg1 is 250 nm.

Figure 11:
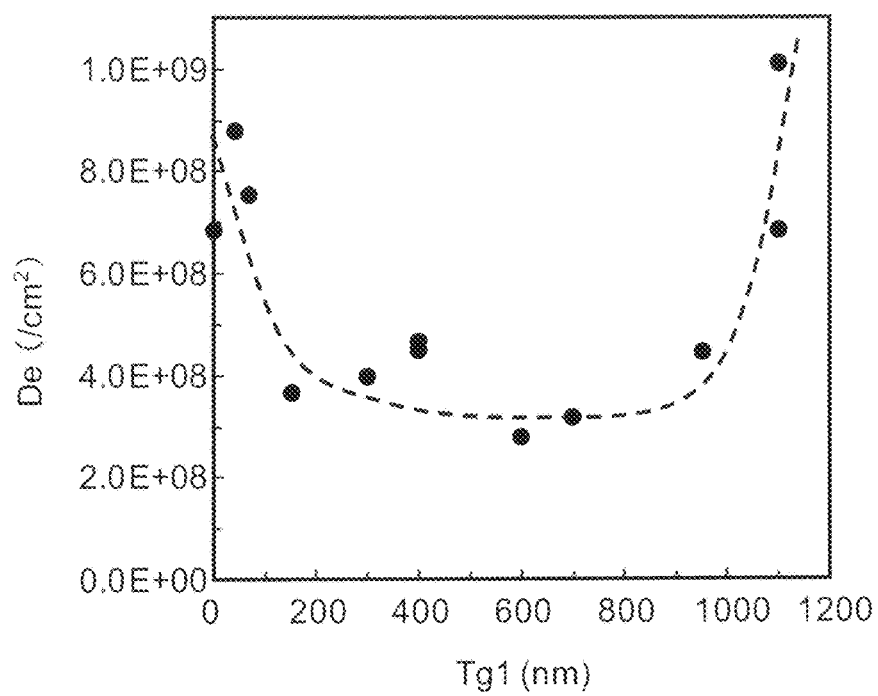
FIG. 11 is a graph showing a characteristic of the nitride semiconductor device according to the first embodiment.

FIG. 11 is a graph illustrating a characteristic of the nitride semiconductor device according to the first embodiment. FIG. 11 shows the relationship between the height tg1 of the protrusion 51gp of the first GaN layer 51g and the edge dislocation density De of the nitride semiconductor device (and the nitride semiconductor wafer).

The horizontal axis of FIG. 11 represents the height tg1 of the protrusion 51gp of the first GaN layer 51g. The height tg1 is the height of the highest protrusion 51gp of the multiple protrusions 51gp observed in the cross-sectional SEM image. This value corresponds to the height of the largest island of the multiple protrusions 51gp observed in the cross-sectional SEM image.

As described above, the height tg1 of the protrusion 51gp of the first GaN layer 51g is changed by changing the growth time TMs1 of the first Si-containing layer 51s (corresponding to the thickness of the first Si-containing layer 51s), the V/III ratio (Rg1(V/III)) when forming the first GaN layer 51g, the growth temperature GTg1 when forming the first GaN layer 51g, and the growth rate GRg1 when forming the first GaN layer 51g. Specifically, the height tg1 is increased by increasing the growth time TMs1 of the first Si-containing layer 51s (making the first Si-containing layer 51s thicker). The height tg1 is increased by reducing the ammonia supply amount (V/III ratio) when forming the first GaN layer 51g. The height tg1 is increased by reducing the growth temperature GTg1 when forming the first GaN layer 51g. The height tg1 is increased by reducing (slowing) the growth rate GRg1 of the first GaN layer 51g.

As shown in FIG. 11, the edge dislocation density De is high in the case where the height tg1 of the protrusion 51gp of the first GaN layer 51g is 0 nm. The case where the height tg1 is 0 nm corresponds to the case where the first GaN layer 51g is flat. On the other hand, the edge dislocation density De is high even in the case where the height tg1 is greater than 1000 nm.

Conversely, the edge dislocation density De is low in the case where the height tg1 of the protrusion 51gp of the first GaN layer 51g is not less than 100 nm and not more than 1000 nm. In the case where the height tg1 is not less than 100 nm and not more than 1000 nm, the edge dislocation density De is not more than $4 \times 10^8$ (/cm$^2$) (e.g., not less than $3 \times 10^8$ (/cm$^2$) and not more than $4 \times 10^8$ (/cm$^2$)).

In the case where the height tg1 of the protrusion 51gp is lower than 100 nm, the formation of the oblique surface 51gs is insufficient; and the proportion of the flat surface (the top surface 51gt) that is perpendicular to the stacking direction to the crystal surface is large. Therefore, it is considered that the bending effect or the blocking effect of the dislocations 80 by the second Si-containing layer 52s provided on the oblique surface 51gs is not sufficiently obtained. In the case where the height tg1 of the protrusion 51gp is lower than 100 nm, it is considered that the propagation direction of the dislocations 80 inside the crystal does not change and the dislocation reduction effect inside the first GaN layer 51g is small because the volume (the surface area) of the crystal of the first GaN layer 51g is small.

In the case where the height tg1 of the protrusion 51gp is higher than 1000 nm, the mutually-adjacent protrusions 51gp combine easily; and the region where the first Si-containing layer 51s and the second Si-containing layer 52s contact each other decreases. As a result, it is considered that the blocking effect of the dislocations 80 occurring at the buffer layer 60 decreases; and the dislocation density increases.

In the case where an unevenness in which the height tg1 is greater than 1000 nm is formed, it becomes difficult to planarize the second GaN layer 52g; and pits form easily in the surface of the second GaN layer 52g. As a result of the experiment, it was found that a flat second GaN layer 52g is obtained in the case where the thickness of the second GaN layer 52g is not less than about 2 times the height tg1 of the protrusion 51gp of the first GaN layer 51g. In the embodiment, the thickness of the second GaN layer 52g is, for example, about 2 μm. The height tg1 of the protrusion 51gp of the first GaN layer 51g is not more than ½ of the thickness of the second GaN layer 52g.

In a flat layer, the region of the surface of the layer that is parallel to the major surface of the layer has a surface area that is not less than 90% of the surface area of the layer.

Thus, it is favorable for the height tg1 of the protrusion 51gp of the first GaN layer 51g to be not less than 100 nm and not more than 1000 nm. In such a case, the dislocation density decreases effectively. More favorably, the height tg1 is not less than 300 nm and not more than 800 nm.

Figure 12:
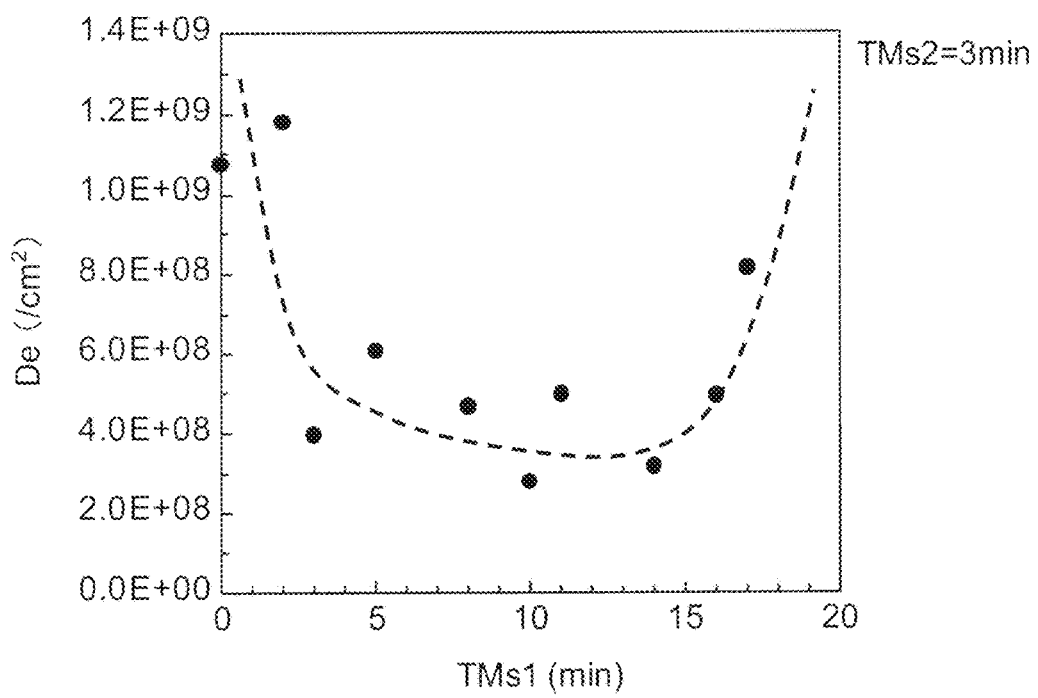
FIG. 12 is a graph showing a characteristic of the nitride semiconductor device according to the first embodiment.

FIG. 12 is a graph illustrating a characteristic of the nitride semiconductor device according to the first embodiment. FIG. 12 shows experimental results relating to the change of the edge dislocation density De as the growth time of the first Si-containing layer 51s is changed. The horizontal axis represents the growth time TMs1 of the first Si-containing layer 51s and corresponds to the thickness of the first Si-containing layer 51s. In the experiment, the growth time TMs2 of the second Si-containing layer 52s is 3 minutes. The first GaN layer 51g is formed using TMGa and ammonia at flow rates of 56 cc/min and 40 L/min, respectively, in a mixed atmosphere of hydrogen and nitrogen having a proportion of 2:1 at a substrate temperature of 1090° C. The growth time of the first GaN layer 51g is 5 minutes.

It can be seen from FIG. 12 that the edge dislocation density De decreases when the growth time TMs1 of the first Si-containing layer 51s is not less than 3 minutes and not more than 16 minutes. The edge dislocation density De is high in the case where the growth time TMs1 is shorter than 3 minutes or longer than 16 minutes. When the growth time TMs1 of the first Si-containing layer 51s is 17 minutes, pits form in the surface of the functional layer 15; and the surface of the functional layer 15 cannot be planarized sufficiently.

In the experiment, the growth time TMs1 of the first Si-containing layer 51s being 8 minutes corresponds to the condition at which the thickness of the first Si-containing layer 51s is 1 atomic layer thick.

From the results of FIG. 12, it can be seen that a low edge dislocation density De is obtained in the case where the thickness of the first Si-containing layer 51s is not less than 0.4 atomic layers thick and not more than 2 atomic layers thick. The dislocation density increases in the case where the thickness of the first Si-containing layer 51s is thinner than 0.4 atomic layers thick. It is considered that this is because the three-dimensional growth of the first GaN layer 51g does not occur easily and the reduction effect of the dislocation density is small. The dislocation density increases in the case where the thickness of the first Si-containing layer 51s is thicker than two atomic layer thick. It is considered that this is because the first GaN layer 51g substantially does not grow.

The thicknesses of the first Si-containing layer 51s and the second Si-containing layer 52s can be estimated by direct observation using a TEM image or by SIMS analysis.

In the case of SIMS analysis, according to the measurement conditions such as the sputter rate, etc., there are cases where the Si concentration is observed to spread in the thickness (depth) direction. In such a case, for example, the number of the Si atoms per unit surface area (the Si surface density) included in the Si-containing layer may be considered to be the sum total of the Si concentration (the integral of the Si atoms in the thickness direction) up to the region where the Si concentration decreases to a value of 10% of the maximum value of the Si concentration in the region corresponding to the Si-containing layer.

The thickness of the Si-containing layer can be estimated using the sum total of the Si concentration (the Si surface density). In other words, the thickness can be estimated as the thickness of a GaN layer in which the Si atoms inside the Si-containing layer are uniformly substituted for Ga atoms (Group III atoms) of the GaN layer.

In the specification of the application, "1 atomic layer thick" is taken to be the thickness of the Si-containing layer in the case where the number of the Si atoms inside the Si-containing layer is the number substituted for the Ga atoms of a GaN layer corresponding to one layer.

The surface density of the Ga atoms (the Group III atoms) of the (0001) plane of a GaN layer is about $1 \times 10^{15}$ (/cm$^2$). Accordingly, the thicknesses of the first Si-containing layer 51s and the second Si-containing layer 52s correspond to being 1 atomic layer thick in the case where the surface density of the Si inside the film is about $1 \times 10^{15}$ (/cm$^2$).

When converting to a surface density of SIMS analysis, for example, the case where the peak value of the Si concentration is $2 \times 10^{20}$ (/cm$^3$) with a spread width of 200 nm corresponds to a Si surface density of about $1 \times 10^{15}$ (/cm$^2$).

In other words, in the case where the Si concentration inside the film is about $2 \times 10^{20}$ (/cm$^3$), the thickness of the Si-containing layer corresponds to being 1 atomic layer thick. Accordingly, the dislocation density decreasing in the case where the thickness of the first Si-containing layer 51s is not less than 0.4 atomic layers thick and not more than 2 atomic layers thick corresponds to the dislocation density decreasing in the case where the Si concentration of the first Si-containing layer 51s is not less than $7 \times 10^{19}$ (/cm$^3$) and not more than $4.0 \times 10^{20}$ (/cm$^3$); and the dislocation density decreases. The dislocation density decreases in the case where the Si surface density inside the film is not less than $3.5 \times 10^{14}$ (/cm$^2$) and not more than $2.0 \times 10^{15}$ (/cm$^2$).

The Si concentration of the first Si-containing layer 51s changes as the growth time TMs1 of the first Si-containing layer 51s changes. The relationship between the dislocation density and the Si concentration of the first Si-containing layer 51s for samples in which the Si concentration of the first Si-containing layer 51s is changed by changing the growth time TMs1 of the first Si-containing layer 51s will now be described.

FIG. 13A and FIG. 13B are graphs illustrating characteristics of the nitride semiconductor device according to the first embodiment.

These drawings show the relationship between the edge dislocation density De and the Si concentration of the first Si-containing layer 51s for the sample shown in FIG. 12. The horizontal axis of FIG. 13A represents a Si concentration CSv1 (/cm$^3$) of the first Si-containing layer 51s. The horizontal axis of FIG. 13B represents a Si surface density CSa1 (/cm$^2$) of the first Si-containing layer 51s. CSv1 substantially is CSa1$\times 2 \times 10^5$.

It can be seen from FIG. 13A that a low edge dislocation density De is obtained when the Si concentration CSv1 of the first Si-containing layer 51s is not less than $7 \times 10^{19}$ and not more than $4 \times 10^{20}$ (/cm$^3$).

It can be seen from FIG. 13B that a low edge dislocation density De is obtained when the Si surface density CSa1 of the first Si-containing layer 51s is not less than $3.5 \times 10^{14}$ and not more than $2 \times 10^{15}$ (/cm$^2$).

FIG. 14 is a graph illustrating a characteristic of the nitride semiconductor device according to the first embodiment. FIG. 14 shows experimental results of the edge dislocation density De as the growth time of the second Si-containing layer 52s is changed. The horizontal axis represents the growth time TMs2 of the second Si-containing layer 52s and corresponds to the thickness of the second Si-containing layer 52s. In the experiment, the growth time TMs1 of the first Si-containing layer 51s is 8 minutes. The first GaN layer 51g is formed using TMGa and ammonia at flow rates of 56 cc/min and 40 L/min, respectively, in a mixed atmosphere of hydrogen and nitrogen having a proportion of 2:1 at a substrate temperature of 1090° C. The growth time of the first GaN layer 51g is 5 minutes.

It can be seen from FIG. 14 that the edge dislocation density De decreases when the growth time TMs2 of the second Si-containing layer 52s is not less than 3 minutes and not more than 12 minutes. The edge dislocation density De is high in the case where the growth time TMs2 is shorter than 3 minutes or longer than 12 minutes.

The thickness of the second Si-containing layer 52s corresponds to being 1 atomic layer thick when the growth time TMs2 of the second Si-containing layer 52s is 8 minutes.

From the results of FIG. 14, a low edge dislocation density De is obtained in the case where the thickness of the second Si-containing layer 52s is not less than 0.4 atomic layers thick and not more than 1.5 atomic layers thick. In the case where the thickness of the second Si-containing layer 52s is thinner than 0.4 atomic layers thick, the bending effect or the blocking effect of the dislocations at the second Si-containing layer 52s is not obtained sufficiently. In the case where the thickness of the second Si-containing layer 52s is thicker than 1.5 atomic layers thick, the growth of the second GaN layer 52g onto the second Si-containing layer 52s is obstructed; and the bending effect or the blocking effect of the dislocations at the second Si-containing layer 52s is not obtained sufficiently. Also, the surface flatness of the second GaN layer 52g decreases.

It can be seen from the results shown in FIG. 14 that the dislocation density decreases easily in the case where the thickness of the second Si-containing layer 52s is not more than the thickness of the first Si-containing layer 51s. An unevenness forms excessively in the second GaN layer 52g and the flatness degrades easily when the thickness of the second Si-containing layer 52s becomes thicker than the thickness of the first Si-containing layer 51s. Therefore, the dislocation density increases. Further, for example, tensile stress occurs due to the excessive unevenness; and cracks increase easily.

The Si concentration of the second Si-containing layer 52s changes as the growth time TMs2 of the second Si-containing layer 52s changes. The relationship between the dislocation density and the Si concentration of the second Si-containing layer 52s for samples in which the Si concentration of the second Si-containing layer 52s is changed by changing the growth time TMs2 of the second Si-containing layer 52s will now be described.

FIG. 15A and FIG. 15B are graphs illustrating characteristics of the nitride semiconductor device according to the first embodiment.

These drawings show the relationship between the edge dislocation density De and the Si concentration of the second Si-containing layer 52s for the sample shown in FIG. 14. The horizontal axis of FIG. 15A represents a Si concentration CSv2 ($/cm^3$) of the second Si-containing layer 52s. The horizontal axis of FIG. 15B represents a Si surface density CSa2 ($/cm^2$) of the second Si-containing layer 52s. CSv2 is substantially CSa2×2×$10^5$. In these drawings, the Si concentration CSv1 of the first Si-containing layer 51s is 2×$10^{20}$ ($/cm^3$); and the Si surface density CSa1 of the first Si-containing layer 51s is 1×$10^{15}$ ($/cm^2$).

It can be seen from FIG. 15A that a low edge dislocation density De is obtained when the Si concentration CSv2 of the second Si-containing layer 52s is not less than 7×$10^{19}$ and not more than 3×$10^{20}$ ($/cm^3$).

It can be seen from FIG. 15B that a low edge dislocation density De is obtained when the Si surface density CSa2 of the second Si-containing layer 52s is not less than 3.5×$10^{14}$ and not more than 1.5×$10^{15}$ ($/cm^2$).

It is favorable for the Si concentration CSv2 of the second Si-containing layer 52s to be not more than the Si concentration CSv1 of the first Si-containing layer 51s. In such a case, as shown in FIG. 15A, the dislocation density decreases easily.

It is favorable for the Si surface density CSa2 of the second Si-containing layer 52s to be not more than the Si surface density CSa1 of the first Si-containing layer 51s. In such a case, as shown in FIG. 15B, the dislocation density decreases easily.

An unevenness forms excessively in the second GaN layer 52g and the flatness degrades easily when the Si concentration CSv2 of the second Si-containing layer 52s becomes larger than the Si concentration CSv1 of the first Si-containing layer 51s. Therefore, the dislocation density increases. Further, for example, tensile stress occurs due to the excessive unevenness; and cracks increase easily.

FIG. 16 is a graph illustrating a characteristic of the nitride semiconductor device according to the first embodiment. FIG. 16 shows the relationship between the edge dislocation density De and the total thickness of the thickness of the first Si-containing layer 51s and the thickness of the second Si-containing layer 52s. The horizontal axis represents the total thickness ts with units of atomic layer thick.

It can be seen from FIG. 16 that a low edge dislocation density De is obtained when the total thickness ts of the thickness of the first Si-containing layer 51s and the thickness of the second Si-containing layer 52s is not less than 0.7 atomic layers thick and not more than 2 atomic layers thick. The dislocation density is high in the case where the total thickness ts is thinner than 0.7 atomic layers thick or thicker than 2 atomic layers thick. In the case where the total thickness ts is thinner than 0.7 atomic layers thick, the bending effect or the blocking effect of the dislocations by the Si-containing layer decreases. In the case where the total thickness ts is thicker than 2 atomic layers thick, the unevenness formation at the GaN layer becomes excessive; and the flatness degrades. Thereby, the dislocation density increases. Also, in the case where the total thickness ts is thicker than 2 atomic layers thick, cracks occur easily due to the occurrence of tensile stress inside the GaN layer due to the unevenness formation; and the crystal quality decreases.

The sum of the Si concentrations of the first Si-containing layer 51s and the second Si-containing layer 52s corresponds to 1.5×$10^{20}$/$cm^3$ when the total thickness ts of the thickness of the first Si-containing layer 51s and the thickness of the second Si-containing layer 52s is 0.7 atomic layers thick. The sum of the Si concentrations of the first Si-containing layer 51s and the second Si-containing layer 52s corresponds to 4.0×$10^{20}$/$cm^3$ when the total thickness ts is 2 atomic layers thick. It is favorable for the sum of the Si concentrations of the first Si-containing layer 51s and the second Si-containing layer 52s to be not less than 1.5×$10^{20}$/$cm^3$ and not more than 4.0×$10^{20}$/$cm^3$.

When the total thickness ts is 0.7 atomic layers thick, the sum of the Si surface densities of the first Si-containing layer 51s and the second Si-containing layer 52s corresponds to 7.5×$10^{14}$/$cm^2$. When the total thickness ts is 2 atomic layers thick, the sum of the Si surface densities of the first Si-containing layer 51s and the second Si-containing layer 52s corresponds to 2.0×$10^{15}$/$cm^2$. It is favorable for the sum of the Si surface densities of the first Si-containing layer 51s and the second Si-containing layer 52s to be not less than 7.5×$10^{14}$/$cm^2$ and not more than 2.0×$10^{15}$/$cm^2$.

Figure 17:
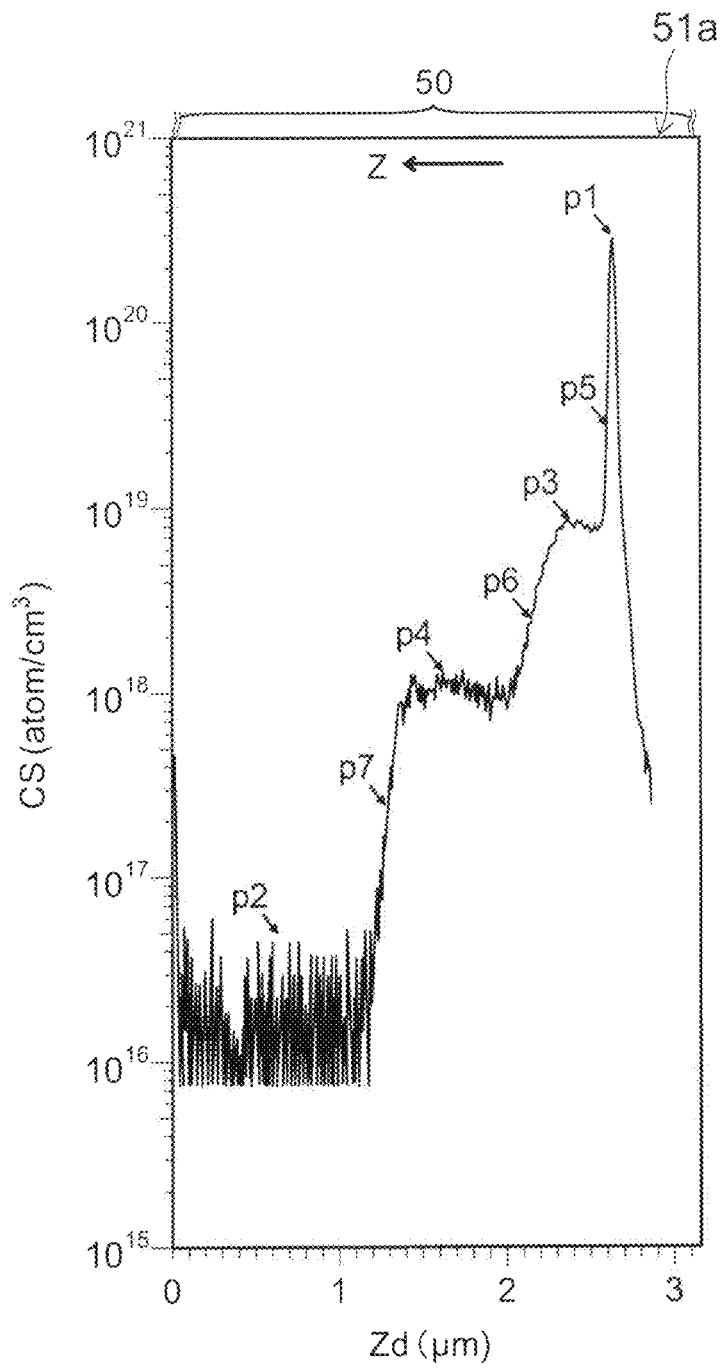
FIG. 17 is a graph showing the nitride semiconductor device according to the first embodiment.

FIG. 17 is a graph illustrating the nitride semiconductor device according to the first embodiment.

FIG. 17 shows an example of SIMS analysis results of the nitride semiconductor device 110 (or the nitride semiconductor wafer 210) according to the embodiment. In the example, the measurements are made at a spacing of 5 nm along the depth (the stacking direction). In FIG. 17, the horizontal axis represents a depth Zd (corresponding to the Z-axis direction position). The vertical axis represents a Si concentration CS (atoms/$cm^3$). In the example, the growth time TMs1 of the first Si-containing layer 51s is 8 minutes. This condition corresponds to the condition at which the Si surface density of the first Si-containing layer 51s is 1.2×$10^{15}$/$cm^2$. The growth time TMs2 of the second Si-containing layer 52s is 3 minutes. This condition corresponds to the condition at which the Si surface density of the second Si-containing layer 52s is 3 0.8×$10^{14}$/$cm^2$.

It can be seen from FIG. 17 that a peak of Si having three levels is observed in the range of the stacked body 50. For example, the Si concentration profile of the stacked body 50 has first to seventh portions p1 to p7. The first to seventh portions p1 to p7 are stacked along the Z-axis direction. The second portion p2 is provided to be higher than the first portion p1.

The first portion p1 has a first concentration in which the Si concentration is not less than 7×$10^{19}$/$cm^3$ and not more than 4×$10^{20}$/$cm^3$.

The second portion p2 has a second concentration in which the Si concentration is lower than that of the first concentration. The second concentration is, for example, less than 2×$10^{17}$/$cm^3$. The Si concentration of the second portion p2 is relatively constant.

The third portion p3 is provided between the first portion p1 and the second portion p2. The third portion p3 has a third concentration in which the Si concentration is between those of the first concentration and the second concentration. The third concentration is, for example, not less than $3\times10^{18}/cm^3$ and not more than $5\times10^{19}/cm^3$. The Si concentration of the third portion p3 is relatively constant.

The fourth portion p4 is provided between the third portion p3 and the second portion p2. The fourth portion p4 has a fourth concentration in which the Si concentration is between those of the third concentration and the second concentration. The fourth concentration is, for example, not less than $2\times10^{17}/cm^3$ and not more than $2\times10^{18}/cm^3$. The Si concentration of the fourth portion p4 is relatively constant.

The fifth portion p5 is provided between the first portion p1 and the third portion p3. The Si concentration change per thickness of the fifth portion p5 is higher than the Si concentration change per thickness of the third portion p3. The Si concentration of the fifth portion p5 abruptly changes.

The sixth portion p6 is provided between the third portion p3 and the fourth portion p4. The Si concentration change per thickness of the sixth portion p6 is higher than the Si concentration change per thickness of the third portion p3. The Si concentration change per thickness of the sixth portion p6 is higher than the Si concentration change per thickness of the fourth portion p4. The Si concentration of the sixth portion p6 abruptly changes.

The seventh portion p7 is provided between the fourth portion p4 and the second portion p2. The Si concentration change per thickness of the seventh portion p7 is higher than the Si concentration change per thickness of the fourth portion p4. The Si concentration change per thickness of the seventh portion p7 is higher than the Si concentration change per thickness of the second portion p2.

The width (the width in the thickness direction) of the peak of the Si concentration of the first portion p1 is narrow. The first portion p1 corresponds to the first Si-containing layer 51s. At least a portion of the fifth portion p5 is further included in the first Si-containing layer 51s.

In the example, the peak (the maximum value) of the Si concentration of the first portion p1 is $2.8\times10^{20}/cm^3$. The width of the peak to where the Si concentration decreases to a value of 10% of the peak value is about 160 nm. The overall Si concentration (the integral of the Si concentration in the thickness direction) of this region is $1.2\times10^{15}/cm^2$ and corresponds to the Si surface density of the first Si-containing layer 51s.

The thickness (the width) of the first portion p1 is, for example, not less than 1 nm and not more than 200 nm. In the case where the thickness of the first portion p1 is less than 1 nm, the three-dimensional growth of the first GaN layer 51g does not sufficiently occur. The growth of the first GaN layer 51g is obstructed, the surface area of the oblique surface decreases, and the reduction effect of the dislocation density is not obtained sufficiently in the case where the thickness of the first portion p1 is thicker than 200 nm.

The third portion p3 and the sixth portion p6 correspond to the first GaN layer 51g and the second Si-containing layer 52s. The Si concentration of the second Si-containing layer 52s is $8.0\times10^{18}/cm^3$. The first GaN layer 51g includes the protrusion 51gp; and the second Si-containing layer 52s is provided on the protrusion 51gp. As described above, the diameter of the protrusion 51gp is, for example, not less than 50 nm and not more than 1500 nm; and the analysis surface area of the SIMS analysis is greater than the size (the surface area) of the protrusion 51gp. Therefore, the Si concentration of the SIMS analysis is detected as the value of the average of the range including the multiple protrusions 51gp (the range of the second GaN layer 52g, the second Si-containing layer 52s, and the first GaN layer 51g). Therefore, in the Si concentration profile, spreading occurs in the thickness (depth) direction; the peak value is smaller than the actual Si concentration; and the third portion p3 and the sixth portion p6 occur.

In the example, the peak of the Si concentration of the third portion p3 is about $8.0\times10^{18}/cm^3$; and width (corresponding to the width of the peak to where the Si concentration decreases to the value of 10% of the peak value) is about 500 nm for the third portion p3 and the sixth portion p6. The overall Si concentration (the integral of the Si concentration in the thickness direction) of this region is $3.8\times10^{14}/cm^2$ and corresponds to the Si surface density of the second Si-containing layer 52s.

The thickness (the width) of the third portion p3 is, for example, not less than 100 nm and not more than 1000 nm. The case where the thickness of the third portion p3 is less than 100 nm corresponds to the case where the height of the first GaN layer 51g is not more than 100 nm. In such a case, the formation of the oblique surface is insufficient; and the reduction effect of the dislocation density decreases. The case where the thickness of the third portion p3 is thicker than 1000 nm corresponds to the case where the height of the first GaN layer 51g is not more than 1000 nm. In such a case, the flatness of the second GaN layer 52g decreases easily.

For example, the fourth portion p4, the seventh portion p7, and the second portion p2 correspond to the second GaN layer 52g. It is considered that Si diffuses from at least one selected from the first Si-containing layer 51s and the second Si-containing layer 52s into a portion (a portion on the lower side) of the second GaN layer 52g. It is considered that the diffusion region of the Si corresponds to the fourth portion p4.

The thickness of the fourth portion p4 is, for example, not less than 300 nm and not more than 2500 nm. In the case where the thickness of the fourth portion p4 is less than 300 nm, the bending effect or the blocking effect of the dislocations at the second Si-containing layer 52s is not obtained sufficiently. In the case where the thickness of the fourth portion p4 is thicker than 2500 nm, the flatness of the second GaN layer 52g decreases easily.

For example, the existence of the first Si-containing layer 51s can be determined by the first portion p1 existing in the SIMS analysis.

The existence of the second Si-containing layer 52s can be determined by observing the first GaN layer 51g including the protrusion 51gp by SEM observation and/or TEM observation. The existence of the second Si-containing layer 52s can be determined by the occurrence of the third portion p3 and the fourth portion p4 in the SIMS analysis.

Figure 18A:
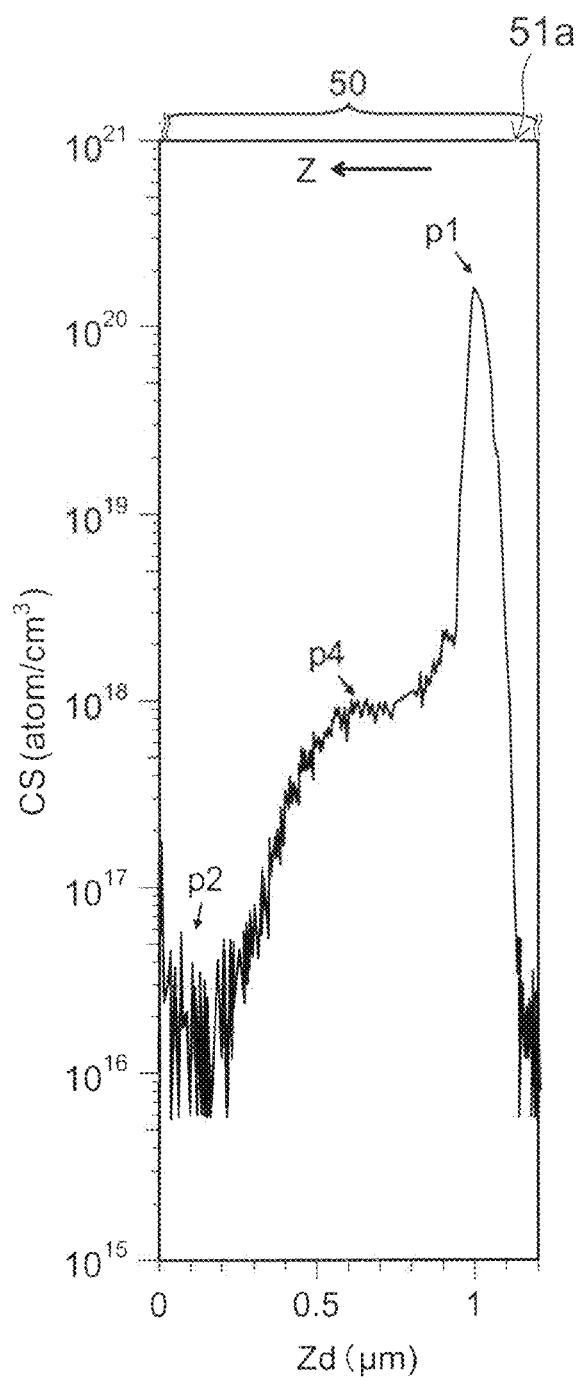
FIG. 18A and FIG. 18B are graphs showing nitride semiconductor devices of reference examples.
Figure 18B:
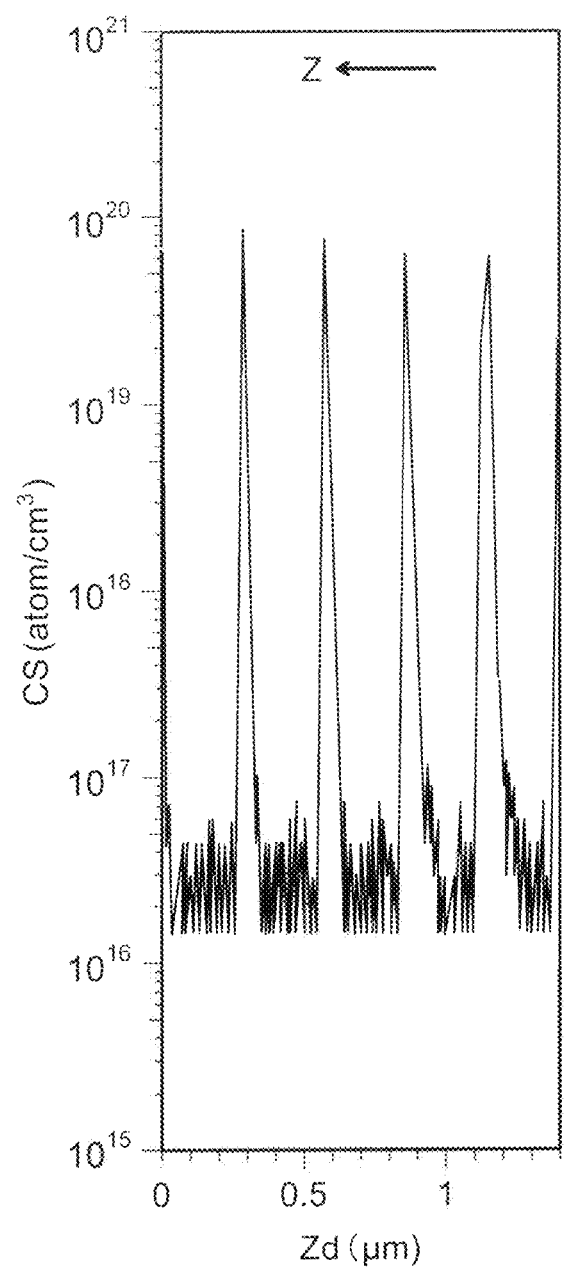

FIG. 18A and FIG. 18B are graphs illustrating nitride semiconductor devices of reference examples.

FIG. 18A and FIG. 18B show examples of SIMS analysis results of the nitride semiconductor device (or the nitride semiconductor wafer) for a first reference example and a second reference example, respectively.

In the first reference example, a GaN layer is provided instead of the AlGaN layer 51a of the stacked body 50; and the first Si-containing layer 51s is provided on the GaN layer. The first GaN layer 51g including the protrusion 51gp is provided on the first Si-containing layer 51s. The second GaN layer 52g is provided on the first GaN layer 51g. In other words, the second Si-containing layer 52s is not provided.

On the other hand, in the second reference example, a flat GaN layer and a flat Si-containing layer are multiply stacked alternately. In the example, the number of the Si-containing layers is four.

As shown in FIG. 18A, the peak of the Si concentration has two levels in the first reference example in which the second Si-containing layer 52s is not provided.

As shown in FIG. 18B, sharp peaks of the Si concentration are observed where the Si-containing layers are provided on the flat GaN layers. The peaks of the Si concentration each have one level.

On the other hand, in the nitride semiconductor device 110 and the nitride semiconductor wafer 210 according to the embodiment as described above, a peak of the Si concentration having three levels is observed.

Figure 19:
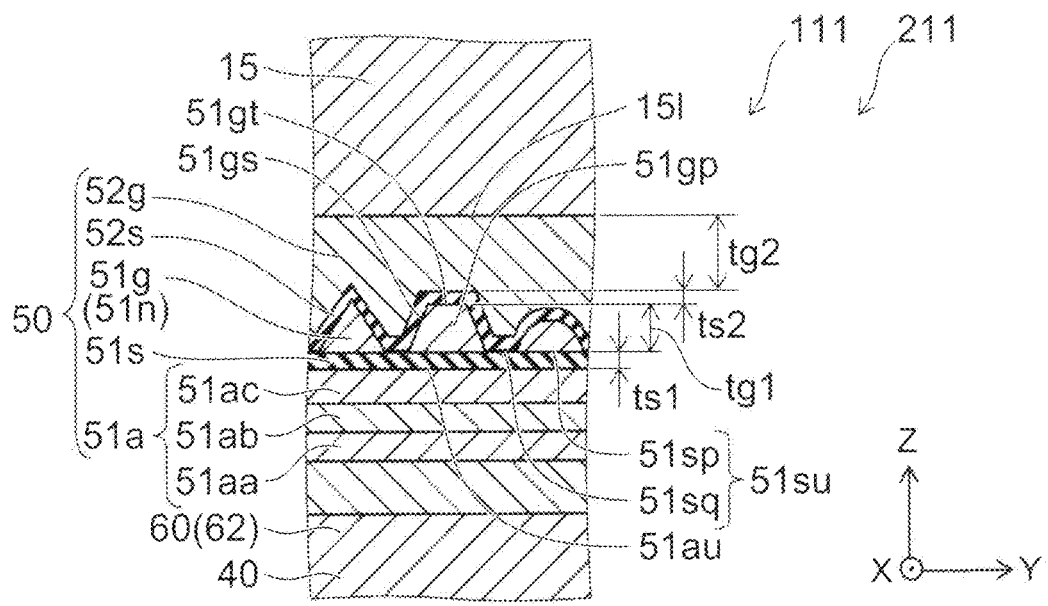
FIG. 19 is a schematic cross-sectional view showing another nitride semiconductor device according to the first embodiment.

FIG. 19 is a schematic cross-sectional view illustrating another nitride semiconductor device according to the first embodiment.

As shown in FIG. 19, an n-GaN layer 51n which is the n-type is used as the first GaN layer 51g in the nitride semiconductor device 111 and the nitride semiconductor wafer 211 according to the embodiment. Otherwise, the configurations are similar to those of the nitride semiconductor device 110 and the nitride semiconductor wafer 210.

According to the nitride semiconductor device 111 and the nitride semiconductor wafer 211 as well, a nitride semiconductor device and a nitride semiconductor wafer having few dislocations can be provided.

Experimental results will now be described.

The n-GaN layer 51n is formed by, for example, supplying TMGa, ammonia, and silane ($SiH_4$) having a concentration of 10 ppm for 5 minutes at flow rates of 56 cc/min, 40 L/min, and 56 cc/min, respectively, in a mixed atmosphere of hydrogen and nitrogen having a proportion of 2:1 at a substrate temperature of 1090° C. The Si concentration of the n-GaN layer 51n is, for example, $5 \times 10^{18}$ (/cm$^3$). In the example, the n-GaN layer 51n is a crystal having an island configuration. The n-GaN layer 51n may be continuous. The n-GaN layer 51n includes the protrusion 51gp. The protrusion 51gp of the n-GaN layer 51n includes the oblique surface 51gs that is tilted with respect to the X-Y plane. The height tg1 of the protrusion 51gp of the n-GaN layer 51n is, for example, about 500 nm. The method for manufacturing the other layers is the same as the manufacturing method described in regard to the nitride semiconductor device 110.

The edge dislocation density De of the nitride semiconductor device 111 is $2.1 \times 10^8$ (/cm$^2$) and is lower than the edge dislocation density ($2.8 \times 10^8$ (/cm$^2$)) of the nitride semiconductor device 110. The dislocation density of the configuration in which the n-GaN layer 51n is provided is reduced to about 75% of that of the configuration in which the first GaN layer 51g is provided.

Examining the configuration of the n-GaN layer 51n by an evaluation similar to the evaluation described in regard to FIG. 9A to FIG. 9C showed that, compared to the case where doping with the n-type impurity (Si) is not performed, the height of the protrusion of the n-GaN layer 51n is higher and the surface area of the oblique surface increases. It is considered that the formation of facets is promoted by the doping with the n-type impurity. It is considered that the blocking effect or the bending effect of the dislocations increases and the dislocations decrease due to the increase of the surface area of the second Si-containing layer 52s formed on the oblique surface 51gs of the protrusion 51gp of the n-GaN layer 51n.

It is favorable for the concentration of the n-type impurity of the n-GaN layer 51n to be not less than $1.0 \times 10^{17}$ (/cm$^3$) and not more than $1.0 \times 10^{19}$ (/cm$^3$). It is more favorable for the concentration of the n-type impurity of the n-GaN layer 51n to be not less than $5.0 \times 10^{17}$ (/cm$^3$) and not more than $6.0 \times 10^{18}$ (/cm$^3$). In the case where the concentration of the n-type impurity of the n-GaN layer 51n is lower than $1.0 \times 10^{17}$ (/cm$^3$), the formation of the facets is insufficient; and the reduction effect of the dislocation density at the second Si-containing layer 52s decreases. In the case where the concentration of the n-type impurity of the n-GaN layer 51n is higher than $1.0 \times 10^{19}$ (/cm$^3$), the growth of the n-GaN layer 51n is obstructed by the n-type impurity; the surface area of the oblique surface 51gs of the protrusion 51gp of the n-GaN layer 51n decreases; and the reduction effect of the dislocation density decreases.

It is favorable for the height tg1 of the protrusion 51gp of the n-GaN layer 51n to be not less than 100 nm and not more than 1000 nm. In such a case, the dislocation density decreases effectively. More favorably, the height tg1 is not less than 300 nm and not more than 800 nm.

In the case where the height tg1 of the protrusion 51gp is lower than 100 nm, the formation of the oblique surface 51gs is insufficient; and the proportion of the flat surface (the top surface 51gt) that is perpendicular to the stacking direction to the crystal surface is large. Therefore, the bending effect or the blocking effect of the dislocations 80 by the second Si-containing layer 52s provided on the oblique surface 51gs is not obtained sufficiently. Also, because the volume (the surface area) of the crystal of the n-GaN layer 51n is small, the propagation direction of the dislocations 80 inside the crystal does not change; and the dislocation reduction effect inside the n-GaN layer 51n decreases.

In the case where the height tg1 of the protrusion 51gp is higher than 1000 nm, the mutually-adjacent protrusions 51gp combine easily; and the region where the first Si-containing layer 51s and the second Si-containing layer 52s contact each other decreases. As a result, it is considered that the blocking effect of the dislocations 80 occurring at the buffer layer 60 decreases; and the dislocation density increases.

Second Embodiment

Figure 20:
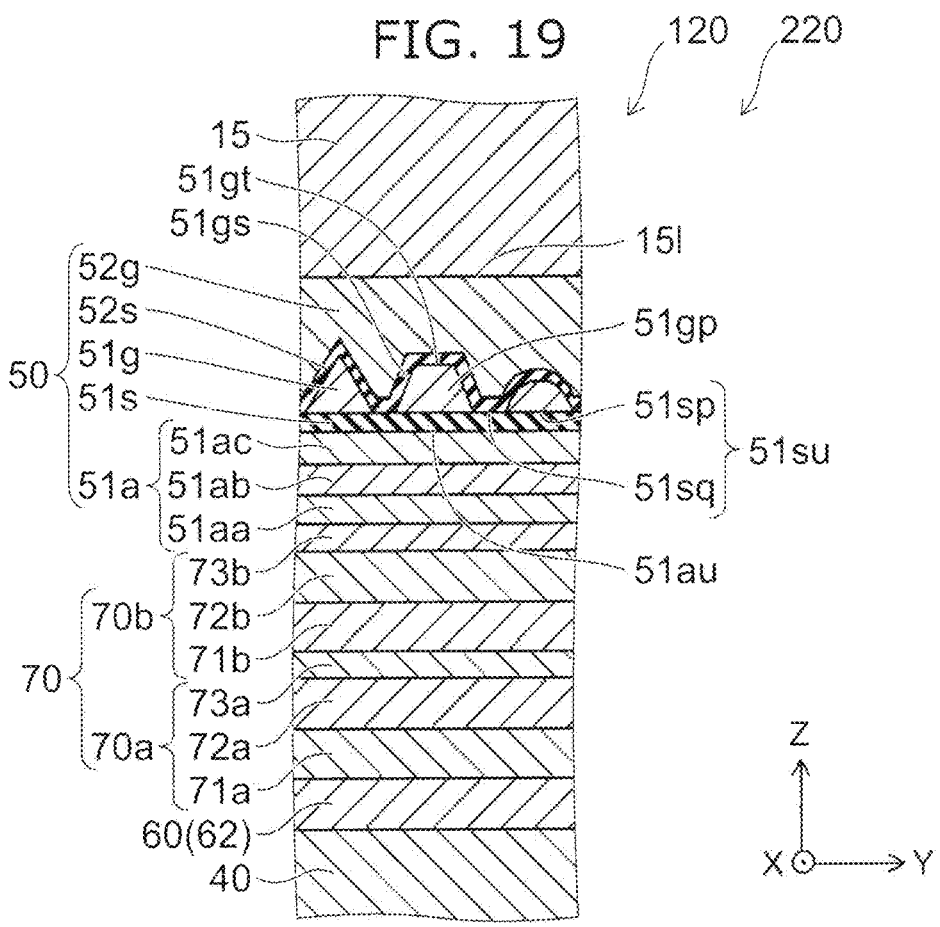
FIG. 20 is a schematic cross-sectional view showing a nitride semiconductor device according to a second embodiment.

FIG. 20 is a schematic cross-sectional view illustrating a nitride semiconductor device according to a second embodiment.

As shown in FIG. 20, the nitride semiconductor device 120 according to the embodiment includes the buffer layer 60, a stacked intermediate layer 70, the stacked body 50, and the functional layer 15. The stacked body 50 is provided on the buffer layer 60. The stacked intermediate layer 70 is provided between the buffer layer 60 and the stacked body 50. The functional layer 15 is provided on the stacked body 50. The nitride semiconductor wafer 220 according to the embodiment includes the substrate 40, the buffer layer 60, the stacked intermediate layer 70, and the stacked body 50. The nitride semiconductor wafer 220 may further include the functional layer 15. The configurations described in regard to the first embodiment are applicable to the substrate 40, the buffer layer 60, the stacked body 50, and the functional layers 15. The stacked intermediate layer 70 will now be described.

In the example, the stacked intermediate layer 70 includes a first intermediate layer 70a and a second intermediate layer 70b. The second intermediate layer 70b is provided on the first intermediate layer 70a.

The first intermediate layer 70a includes a first AlGaN intermediate layer 71a, a first GaN intermediate layer 72a, and a first AlN intermediate layer 73a. The first GaN intermediate layer 72a is provided on the first AlGaN intermediate layer 71a. The first AlN intermediate layer 73a is provided on the first GaN intermediate layer 72a.

The second intermediate layer 70b includes a second AlGaN intermediate layer 71b, a second GaN intermediate layer 72b, and a second AlN intermediate layer 73b. The second GaN intermediate layer 72b is provided on the second AlGaN intermediate layer 71b. The second AlN intermediate layer 73b is provided on the second GaN intermediate layer 72b.

In the example, the configuration including the AlGaN intermediate layer, the GaN intermediate layer, and the AlN intermediate layer is stacked twice. The number of times the configuration is stacked may be one, three, or more.

In the first intermediate layer 70a of the embodiment, the lattice spacing in a direction perpendicular to the stacking direction (the Z-axis direction) (in the example, corresponding to the lattice spacing of the a-axis) is greatest at the first GaN intermediate layer 72a and decreases abruptly at the first AlN intermediate layer 73a. In the second intermediate layer 70b, the lattice spacing in a direction perpendicular to the stacking direction (the Z-axis direction) (in the example, corresponding to the lattice spacing of the a-axis) is greatest at the second GaN intermediate layer 72b and decreases abruptly at the second AlN intermediate layer 73b.

In the specification, the lattice constant is taken to be the unstrained lattice spacing of the nitride semiconductor. The lattice spacing is taken to be the length of the actual lattice of the nitride semiconductor layer that is formed. The lattice constant is, for example, a physical property constant. The lattice spacing is, for example, the length of the actual lattice of the nitride semiconductor layer included in the nitride semiconductor device that is formed. The lattice spacing is determined, for example, from X-ray diffraction measurements.

The first AlGaN intermediate layer 71a is formed on the buffer layer 60 (e.g., AlN buffer layer 62). The formation temperature of the first AlGaN intermediate layer 71a is, for example, about 1040° C. In the state in which the AlGaN is thin, that is, in the initial growth state, the AlGaN is formed to have lattice matching with the lattice constant of the AlN and grows while being subjected to compressive strain. The strain gradually relaxes as the growth of the AlGaN progresses; and the AlGaN approaches the lattice spacing of $Al_xGa_{1-x}N$ in the state without strain.

The first GaN intermediate layer 72a that has a lattice constant that is greater than that of the first AlGaN intermediate layer 71a is formed on the first AlGaN intermediate layer 71a. The formation temperature of the first GaN intermediate layer 72a is, for example, about 1090° C. The thickness of the first GaN intermediate layer 72a is, for example, about 300 nm. The first GaN intermediate layer 72a is formed to have lattice matching with the lattice constant of the AlGaN in the initial growth state and grows while being subjected to compressive strain. Then, the strain gradually relaxes as the growth of the GaN progresses; and the lattice constant of the GaN approaches the lattice constant of GaN in the state without strain.

The first AlN intermediate layer 73a is formed on the first GaN intermediate layer 72a. The thickness of the first AlN intermediate layer 73a is, for example, about 12 nm. It is favorable for the crystal growth temperature of the first AlN intermediate layer 73a to be, for example, not less than 500° C. and not more than 1050° C. The formation temperature of the first AlN intermediate layer 73a is, for example, 800° C. Therefore, lattice relaxation of the first AlN intermediate layer 73a is easy. Thereby, the first AlN intermediate layer 73a is not easily subjected to the tensile strain from the first GaN intermediate layer 72a which is the foundation from the initial state of the formation of the first AlN intermediate layer 73a. As a result, the first AlN intermediate layer 73a can be formed to reduce the effect of the strain from the first GaN intermediate layer 72a which is the foundation. Thus, the first AlN intermediate layer 73a having lattice relaxation is formed on the first GaN intermediate layer 72a.

Continuing, the second AlGaN intermediate layer 71b is formed on the first AlN intermediate layer 73a. The composition ratio of the Al (the proportion of the Al in the Group III elements) of the second AlGaN intermediate layer 71b is not more than a relaxation rate α of the first AlN intermediate layer 73a.

The relaxation rate α is the ratio of the difference between lattice spacing dg of a first axis (e.g., the a-axis) of unstrained GaN and an actual lattice spacing Da of the first axis (e.g., the a-axis) of the first AlN intermediate layer 73a to the absolute value of the difference between the lattice spacing dg of the first axis (e.g., the a-axis) of unstrained GaN and lattice spacing da of the first axis (e.g., the a-axis) of unstrained AlN. The first axis is one axis perpendicular to the stacking direction (the Z-axis direction).

It is favorable for the thickness of the second AlGaN intermediate layer 71b to be, for example, not less than 5 nm and not more than 100 nm. The effect of suppressing the occurrence of the cracks and the effect of reducing the dislocations are not obtained easily in the case where the thickness of the second AlGaN intermediate layer 71b is thinner than 5 nm. The effect of reducing the dislocations saturates in the case where the thickness of the second AlGaN intermediate layer 71b is thicker than 100 nm. Further, cracks occur easily. More favorably, the thickness of the second AlGaN intermediate layer 71b is less than 50 nm. The dislocation density can be effectively reduced by the thickness of the second AlGaN intermediate layer 71b being less than 50 nm. The thickness of the second AlGaN intermediate layer 71b is, for example, about 25 nm.

A greater effect of being grown to have lattice matching with the lattice constant of the AlN can be obtained in the case where the formation temperature of the second AlGaN intermediate layer 71b is higher than the formation temperature of the first AlN intermediate layer 73a by not less than 80° C. Also, a greater effect of reducing the dislocations can be obtained. The formation temperature of the second AlGaN intermediate layer 71b is, for example, about 1120° C.

The second GaN intermediate layer 72b is formed on the second AlGaN intermediate layer 71b. A configuration similar to that of the first GaN intermediate layer 72a is applicable to the second GaN intermediate layer 72b.

The second AlN intermediate layer 73b is formed on the second GaN intermediate layer 72b. A configuration similar to that of the first AlN intermediate layer 73a is applicable to the second AlN intermediate layer 73b.

An example of the method for manufacturing the nitride semiconductor device 120 (and the nitride semiconductor wafer 220) according to the embodiment will now be described.

The substrate 40 is heated to 1080° C.; and trimethylaluminum (TMAl) and ammonia ($NH_3$) are supplied for minutes at flow rates of 50 cc/min and 0.8 L/min, respectively, in a mixed atmosphere of hydrogen and nitrogen having a proportion of 2:1. Thereby, the buffer layer 60 (the AlN buffer layer 62) of AlN is formed. The thickness of the AlN buffer layer 62 is about 100 nm.

The substrate temperature is set to be 1040° C.; and TMGa, TMAl, and ammonia are supplied for 11 minutes at flow rates of 18 cc/min, 25 cc/min, and 2.5 L/min, respectively. Thereby, the first AlGaN intermediate layer 71a is formed. The Al composition ratio of the first AlGaN intermediate layer 71a is, for example, 0.25.

TMGa and ammonia are supplied for 15 minutes at flow rates of 56 cc/min and 40 L/min, respectively, at a substrate temperature of 1090° C. Thereby, the first GaN intermediate layer 72a is formed. The thickness of the first GaN layer 51g is, for example, about 300 nm.

TMAl and ammonia are supplied for 3 minutes at flow rates of 17 cc/min and 10 L/min, respectively, at a substrate temperature of 800° C. Thereby, the first AlN intermediate layer 73a is formed. The thickness of the first AlN intermediate layer 73a is, for example, about 12 nm.

TMGa, TMAl, and ammonia are supplied for 2.5 minutes at flow rates of 18 cc/min, 6 cc/min, and 2.5 L/min, respectively, at a substrate temperature of 1120° C. Thereby, the second AlGaN intermediate layer 71b is formed. The Al composition ratio of the second AlGaN intermediate layer 71b is, for example, 0.5.

TMGa and ammonia are supplied for 15 minutes at flow rates of 56 cc/min and 40 minutes, respectively, at a substrate temperature of 1090° C. Thereby, the second GaN intermediate layer 72b is formed. The thickness of the second GaN intermediate layer 72b is, for example, about 300 nm.

TMAl and ammonia are supplied for 3 minutes at flow rates of 17 cc/min and 10 L/min, respectively, at a substrate temperature of 800° C. Thereby, the second AlN intermediate layer 73b is formed. The thickness of the second AlN intermediate layer 73b is, for example, about 12 nm. The stacked intermediate layer 70 is formed as in the description recited above.

The stacked body 50 and the functional layer 15 are formed on the stacked intermediate layer 70. The conditions described in regard to the first embodiment are applied to the stacked body 50 and the functional layer 15.

Thereby, the nitride semiconductor device 120 and the nitride semiconductor wafer 220 according to the embodiment are constructed.

In the nitride semiconductor device 120 and the nitride semiconductor wafer 220 according to the embodiment, the edge dislocation density De has the low value of $2.0 \times 10^8$ (/cm$^2$).

In the nitride semiconductor device 110 and the nitride semiconductor wafer 210 according to the first embodiment, the edge dislocation density De is $2.8 \times 10^8$ (/cm$^3$) (the first sample 151 shown in FIG. 7). The dislocation density of the configuration in which the stacked intermediate layer 70 is provided is reduced to about 70% of that of the configuration in which the stacked intermediate layer 70 is not provided.

The warp of the nitride semiconductor device 120 and the nitride semiconductor wafer 220 that include the substrate 40 at room temperature has a concave configuration; and the size of the warp is about 10 μm. On the other hand, the warp of the nitride semiconductor device 110 and the nitride semiconductor wafer 210 according to the first embodiment has a concave configuration; and the size of the warp is about 40 μm. The warp of the configuration in which the stacked intermediate layer 70 is provided is less than that of the configuration in which the stacked intermediate layer 70 is not provided. That is, the tensile strain occurring in the nitride semiconductor device 120 and the nitride semiconductor wafer 220 can be reduced by providing the stacked intermediate layer 70; and cracks can be reduced.

Thus, the stacked intermediate layer 70 includes the GaN intermediate layer (e.g., the first GaN intermediate layer 72a), the AlN intermediate layer (e.g., the first AlN intermediate layer 73a), and the AlGaN intermediate layer (e.g., the second AlGaN intermediate layer 71b). The AlN intermediate layer (e.g., the first AlN intermediate layer 73a) is provided on the GaN intermediate layer (e.g., the first GaN intermediate layer 72a). The AlGaN intermediate layer (e.g., the second AlGaN intermediate layer 71b) is provided on the AlN intermediate layer (e.g., the first AlN intermediate layer 73a).

Thus, a nitride semiconductor device and a nitride semiconductor wafer having an even lower dislocation density are obtained by providing the stacked intermediate layer 70 between the buffer layer 60 and the stacked body 50. Further, by providing the stacked intermediate layer 70, the warp can be reduced; and cracks can be suppressed.

The lattice spacing of the first axis perpendicular to the stacking direction (in the example, corresponding to the lattice spacing of the a-axis) of the first AlN intermediate layer 73a can be evaluated by X-ray diffraction measurements. In such measurements, the lattice spacing Da of the first AlN intermediate layer 73a is 0.3145 nm and is greater than 0.3112 nm which is the lattice spacing da of unstrained AlN. Therefore, compressive stress occurs in the second AlGaN intermediate layer 71b formed on the first AlN intermediate layer 73a. The lattice spacing dg of the a-axis of unstrained GaN is 0.3189 nm. Accordingly, the relaxation rate α of the first AlN intermediate layer 73a corresponds to 0.57.

On the other hand, cracks occurred in the reference example in which the second AlGaN intermediate layer 71b having an Al composition ratio of 0.7 was formed. By performing an evaluation for this sample similar to that recited above, it was found that tensile stress occurs in the second AlGaN intermediate layer 71b. In other words, even though the AlGaN layer that has the Al composition ratio of 0.7 and an unstrained lattice spacing that is greater than that of AlN is formed on the AlN layer, tensile stress occurs in the AlGaN layer. This is because the first AlN intermediate layer 73a is distorted and the actual lattice spacing is greater than the unstrained lattice spacing.

Thus, a high-quality nitride semiconductor device having few cracks is obtained by forming the AlGaN intermediate layer having the Al composition ratio that is not more than the relaxation rate α.

According to such a nitride semiconductor device 120 and such a nitride semiconductor wafer 220, a nitride semiconductor device and a nitride semiconductor wafer having few dislocations can be provided. Also, cracks can be suppressed.

Figure 21:
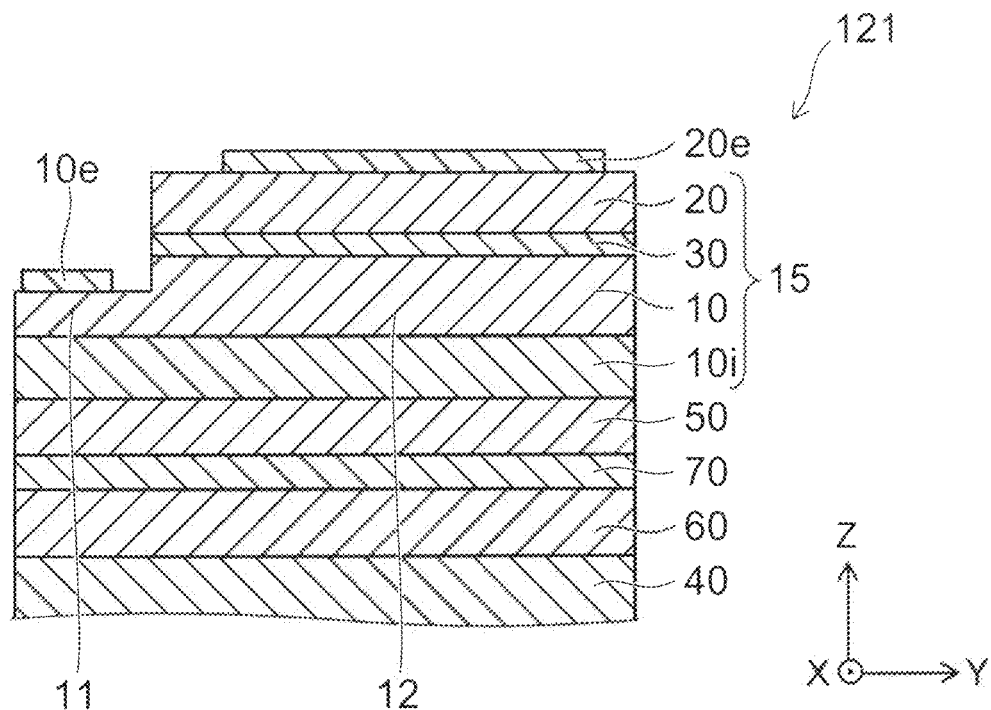
FIG. 21 is a schematic cross-sectional view showing a nitride semiconductor device according to the embodiment.

FIG. 21 is a schematic cross-sectional view illustrating a nitride semiconductor device according to the embodiment.

As shown in FIG. 21, the nitride semiconductor device 121 according to the embodiment further includes a first electrode 10e and a second electrode 20e. The n-type semiconductor layer 10, the p-type semiconductor layer 20, and the light emitting layer 30 are provided in the functional layer 15. In the example, the low impurity concentration layer 10i also is provided. The nitride semiconductor device 121 is a semiconductor light emitting device.

In the example, the n-type semiconductor layer 10 has a first portion 11 and a second portion 12. The second portion 12 is arranged with the first portion 11 in the X-Y plane. The light emitting layer 30 is provided between the second portion 12 and the p-type semiconductor layer 20.

The first electrode 10e is electrically connected to the first portion 11 of the n-type semiconductor layer 10. The second electrode 20e is electrically connected to the p-type semiconductor layer 20. Light is emitted from the light emitting layer 30 by supplying a current to the functional layer 15 via the first electrode 10e and the second electrode 20e.

By the stacked body 50 according to the embodiment being provided in the nitride semiconductor device 121, the dislocation density is low; and as a result, for example, a high luminous efficiency is obtained.

Figure 22:
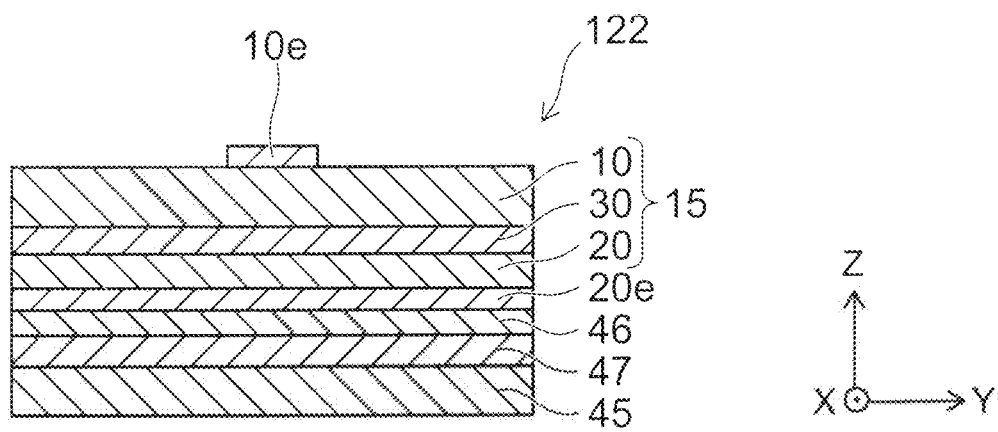
FIG. 22 is a schematic cross-sectional view showing a nitride semiconductor device according to the embodiment.

FIG. 22 is a schematic cross-sectional view illustrating a nitride semiconductor device according to the embodiment.

As shown in FIG. 22, the first electrode 10e and the second electrode 20e are provided in the nitride semiconductor device 122 according to the embodiment. In the example, the substrate 40, the buffer layer 60, and the stacked body 50 are removed after the functional layer 15 is formed on the stacked body 50. For example, the second electrode 20e is formed on the p-type semiconductor layer 20 after forming the n-type semiconductor layer 10, the light emitting layer 30, and the p-type semiconductor layer 20 of the functional layer 15. Then, a first bonding metal layer 46 is formed on the second electrode 20e. On the other hand, a support substrate 45 (e.g., a silicon plate, etc.) in which a second bonding metal layer 47 is formed on the major surface is prepared. The first bonding metal layer 46 and the second bonding metal layer 47 are bonded to each other. Subsequently, at least a portion of the substrate 40 that is used for the crystal growth, the buffer layer 60, and the stacked body 50 is removed.

By using the functional layer 15 that is formed on the stacked body 50 according to the embodiment in the nitride semiconductor device 122, the dislocation density is low; and as a result, for example, a high luminous efficiency is obtained.

Figure 23:
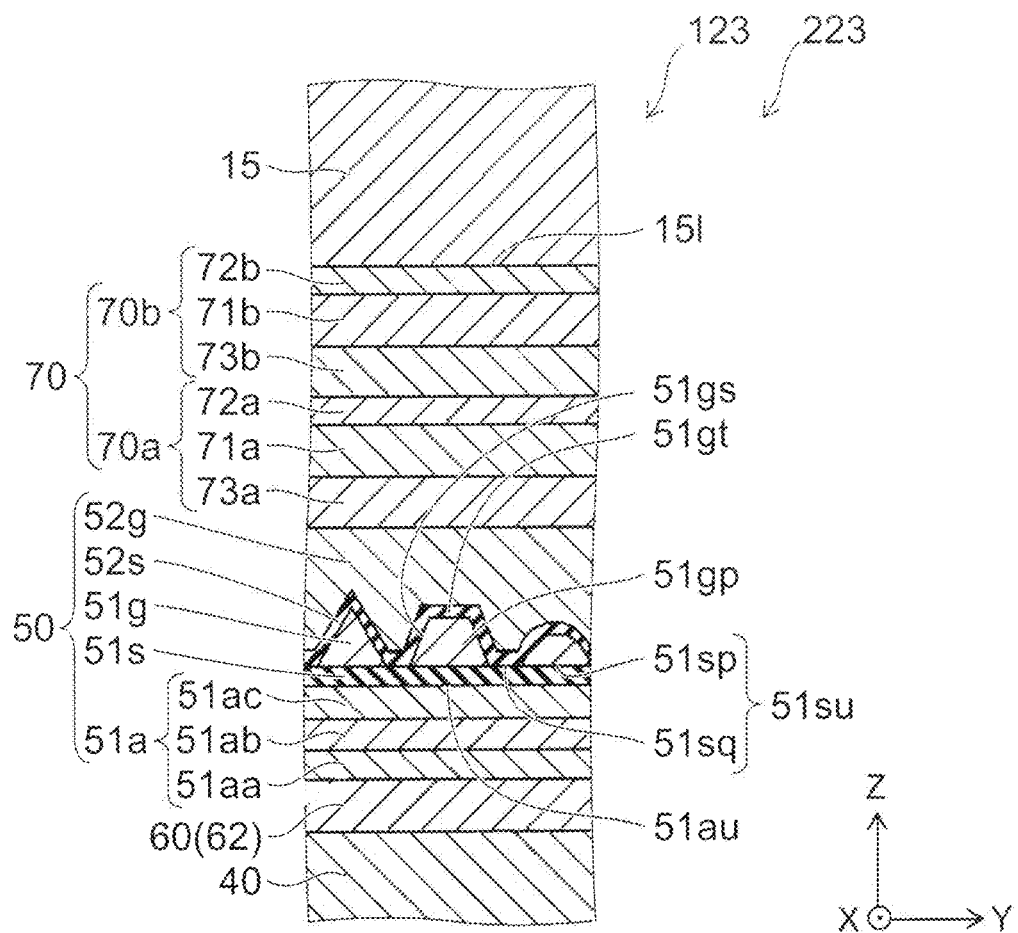
FIG. 23 is a schematic cross-sectional view showing another nitride semiconductor device according to the embodiment.

FIG. 23 is a schematic cross-sectional view illustrating another nitride semiconductor device according to the embodiment.

As shown in FIG. 23, the nitride semiconductor device 123 according to the embodiment includes the buffer layer 60, the stacked intermediate layer 70, the stacked body 50, and the functional layer 15. The stacked body 50 is provided on the buffer layer 60. The stacked intermediate layer 70 is provided on the stacked body 50. The functional layer 15 is provided on the stacked intermediate layer 70. A nitride semiconductor wafer 223 according to the embodiment includes the substrate 40, the buffer layer 60, the stacked intermediate layer 70, and the stacked body 50. The nitride semiconductor wafer 220 may further include the functional layer 15. The configuration described in regard to the nitride semiconductor device 120 is applicable to the substrate 40, the buffer layer 60, the stacked body 50, the stacked intermediate layer 70, and the functional layers 15.

In the nitride semiconductor device 123 (and the nitride semiconductor wafer 223), the stacked intermediate layer 70 includes the first intermediate layer 70a and the second intermediate layer 70b. The second intermediate layer 70b is provided on the first intermediate layer 70a.

The first intermediate layer 70a includes the first AlGaN intermediate layer 71a, the first GaN intermediate layer 72a, and the first AlN intermediate layer 73a. The first AlGaN intermediate layer 71a is provided on the first AlN intermediate layer 73a. The first GaN intermediate layer 72a is provided on the first AlGaN intermediate layer 71a.

The second intermediate layer 70b includes the second AlGaN intermediate layer 71b, the second GaN intermediate layer 72b, and the second AlN intermediate layer 73b. The second AlN intermediate layer 73b is provided on the first GaN intermediate layer 72a. The second AlGaN intermediate layer 71b is provided on the second AlN intermediate layer 73b. The second GaN intermediate layer 72b is provided on the second AlGaN intermediate layer 71b.

The manufacturing method described in regard to the nitride semiconductor device 120 may be modified appropriately and applied to the method for manufacturing the nitride semiconductor device 123 (and the nitride semiconductor wafer 223).

In the nitride semiconductor device 123 and the nitride semiconductor wafer 223, the edge dislocation density De has the low value of $2.2 \times 10^8$ (/cm$^2$).

The warp of the nitride semiconductor device 123 and the nitride semiconductor wafer 223 that include the substrate 40 has a convex configuration at room temperature; and the size of the warp is about 10 μm.

On the other hand, the warp of the nitride semiconductor device 110 and the nitride semiconductor wafer 210 that include the substrate 40 has a concave configuration; and the size of the warp is about 40 μm. The warp of the nitride semiconductor device 120 and the nitride semiconductor wafer 220 that include the substrate 40 has a concave configuration; and the size of the warp is about 10 μm.

As in the nitride semiconductor device 123 and the nitride semiconductor wafer 223, the tensile strain occurring in the nitride semiconductor device can be reduced and the effect of reducing the cracks increases by providing the stacked intermediate layer 70 on the stacked body 50.

Figure 24:
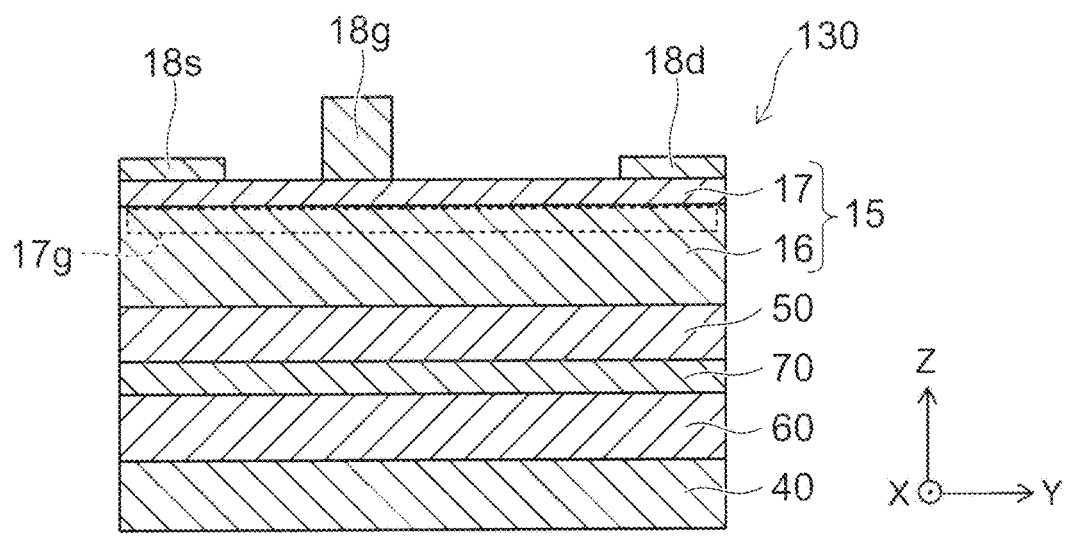
FIG. 24 is a schematic cross-sectional view showing a nitride semiconductor device according to the embodiment.

FIG. 24 is a schematic cross-sectional view illustrating a nitride semiconductor device according to the embodiment.

As shown in FIG. 24, the nitride semiconductor device 130 according to the embodiment is a HEMT (High Electron Mobility Transistor) device. A first layer 16, a second layer 17, a gate electrode 18g, a source electrode 18s, and a drain electrode 18d are provided at the functional layer 15 in the nitride semiconductor device 130.

The first layer 16 is provided on the stacked body 50. The second layer 17 is provided on the first layer 16. The first layer 16 may include, for example, undoped $Al_\alpha Ga_{1-\alpha}N$ ($0 \leq \alpha \leq 1$) not including an impurity. The second layer 17 may include, for example, undoped or n-type $Al_\beta Ga_{1-\beta}N$ ($0 \leq \beta \leq 1$ and $\alpha < \beta$). For example, the first layer 16 includes an undoped GaN layer; and the second layer 17 includes an undoped or n-type AlGaN layer.

The gate electrode 18g, the source electrode 18s, and the drain electrode 18d are provided on the second layer 17. The source electrode 18s is separated from the drain electrode 18d in the X-Y plane. The source electrode 18s and the drain electrode 18d have ohmic contacts with the second layer 17. The gate electrode 18g is disposed on the second layer 17 between the source electrode 18s and the drain electrode 18d. The gate electrode 18g has a Schottky contact with the second layer 17.

The lattice constant of the second layer 17 is smaller than the lattice constant of the first layer 16. Thereby, strain occurs in the second layer 17; and piezoelectric polarization occurs inside the second layer 17 due to the piezoelectric effect. A two-dimensional electron gas 17g is formed in the first layer 16 proximal to the interface between the second layer 17 and the first layer 16. By controlling the voltage applied to the gate electrode 18g in the nitride semiconductor device 130, the two-dimensional electron gas concentration under the gate electrode 18g increases or decreases; and the current flowing between the source electrode 18s and the drain electrode 18d is controlled.

In the nitride semiconductor device 130, the dislocation density is low by using the functional layer 15 formed on the stacked body 50 according to the embodiment; and as a result, good electrical characteristics are obtained.

In the example, the stacked body 50 may be provided on the buffer layer 60; the stacked intermediate layer 70 may be provided on the stacked body 50; and the functional layer 15 may be provided on the stacked intermediate layer 70.

Third Embodiment

Figure 25:
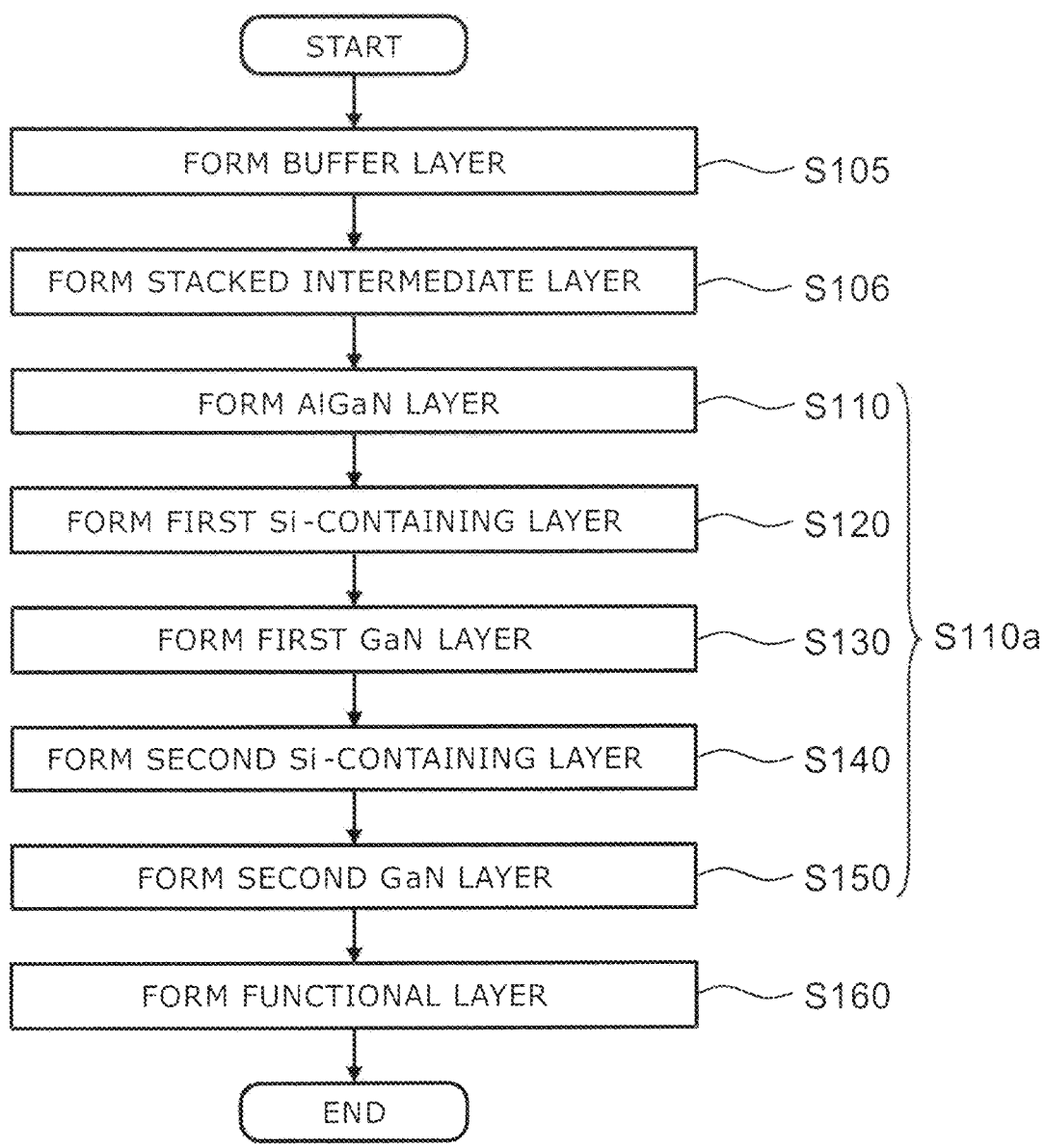
FIG. 25 is a flowchart showing the method for forming the nitride semiconductor layer according to the third embodiment.

FIG. 25 is a flowchart illustrating the method for forming the nitride semiconductor layer according to the third embodiment.

As shown in FIG. 25, the method for forming the nitride semiconductor layer according to the embodiment includes forming the AlGaN layer 51*a* of $Al_xGa_{1-x}N$ ($0 < x \leq 1$) on the buffer layer 60 including a nitride semiconductor provided on the substrate 40 (step S110).

Then, the first Si-containing layer 51*s* containing Si at a concentration that is not less than $7 \times 10^{19}$ (/cm$^3$) and not more than $4 \times 10^{20}$/cm$^3$ is formed to contact the upper surface 51*au* of the AlGaN layer 51*a* (step S120).

Continuing, the first GaN layer 51*g* including the protrusion 51*gp* that has the oblique surface 51*gs* that is tilted with respect to the upper surface 51*au* is formed on the first Si-containing layer 51*s* (step S130).

Then, the second Si-containing layer 52*s* containing Si is formed on the first GaN layer 51*g* (step S140).

Continuing, the second GaN layer 52*g* is formed on the second Si-containing layer 52*s* (step S150).

Thereby, the stacked body 50 including the AlGaN layer 51*a*, the first Si-containing layer 51*s*, the first GaN layer 51*g*, the second Si-containing layer 52*s*, and the second GaN layer 52*g* is formed (step S110*a*).

According to the formation method, a method for forming a nitride semiconductor layer having few dislocations can be provided.

As shown in FIG. 25, the formation method may further include processing to form the functional layer 15 on the second GaN layer 52*g* (step S160). The formation method may further include processing to form the buffer layer 60 on the substrate 40 (step S105). The formation method may further include processing to form the stacked intermediate layer 70 on the buffer layer 60 (step S106). In such a case, the AlGaN layer 51*a* is formed on the stacked intermediate layer 70 in the formation of the AlGaN layer 51*a* (step S110).

In the embodiments, for example, metal-organic chemical vapor deposition (MOCVD), metal-organic vapor phase epitaxy (MOVPE), molecular beam epitaxy (MBE), hydride vapor phase epitaxy (HVPE), etc., may be used to grow the nitride semiconductor layers.

For example, in the case where MOCVD or MOVPE is used, the following source materials may be used when forming the semiconductor layers. For example, TMGa (trimethylgallium) and TEGa (triethylgallium) may be used as the source material of Ga. For example, TMIn (trimethylindium), TEIn (triethylindium), etc., may be used as the source material of In. For example, TMAl (trimethylaluminum), etc., may be used as the source material of Al. For example, $NH_3$ (ammonia), MMHy (monomethylhydrazine), DMHy (dimethylhydrazine), etc., may be used as the source material of N. $SiH_4$ (monosilane), $Si_2H_6$ (disilane), etc., may be used as the source material of Si.

According to the embodiments, a nitride semiconductor device, a nitride semiconductor wafer, and a method for forming a nitride semiconductor layer having few dislocations can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in nitride semiconductor devices and nitride semiconductor wafers such as substrates, buffer layers, stacked intermediate layers, stacked bodies, AlGaN layers, GaN layers, Si-containing layers, functional layers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all nitride semiconductor devices, nitride semiconductor wafers, and methods for forming semiconductor nitride semiconductor layers practicable by an appropriate design modification by one skilled in the art based on the nitride semiconductor devices, the nitride semiconductor wafers, and the methods for forming nitride semiconductor layers described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device, comprising:
a stacked body comprising:
a first Si-containing layer comprising Si at a concentration not less than $7 \times 10^{19}$/cm$^3$ and not more than $4 \times 10^{20}$/cm$^3$, the first Si-containing layer having an upper surface, the upper surface of the first Si-containing layer having a first region and a second region,
a first GaN layer provided on the first region and including a protrusion having an oblique surface tilted with respect to the upper surface of the first Si-containing layer, a second Si-containing layer provided on the first GaN layer and comprising Si, a portion of the second Si-containing layer physically contacting the second region of the upper surface of the first Si-containing layer, and a second GaN layer provided on the second Si-containing layer and physically contacting the portion of the second Si-containing layer; and a functional layer provided on the stacked body and including a nitride semiconductor, wherein the first Si-containing layer comprises a first plurality of discontinuous islands or is a first film having a first opening, and the second Si-containing layer comprises a second plurality of discontinuous islands or is a second film having a second opening.

2. The device according to claim 1, wherein
the first GaN layer comprises a plurality of first dislocations communicating with the oblique surface,
the second GaN layer comprises a plurality of third dislocations,
at least one of the third dislocations is continuous with the first dislocations via the second Si-containing layer, and
a number of the third dislocations continuous with the first dislocations is less than a number of the first dislocations.

3. The device according to claim 1, wherein
the protrusion of the first GaN layer further comprises a top surface parallel to the upper surface of the first Si-containing layer,
the first GaN layer comprises:
a plurality of first dislocations communicating with the oblique surface, and
a plurality of second dislocations communicating with the top surface of the first GaN layer,
the second GaN layer comprises a plurality of third dislocations,
at least one of the third dislocations is continuous with the second dislocations, and
a ratio of a number of the third dislocations continuous with the first dislocations to a number of the plurality of first dislocations is lower than a ratio of a number of the third dislocations continuous with the second dislocations to a number of the second dislocations.

4. The device according to claim 1, wherein a height of the protrusion of the first GaN layer is not less than 100 nm and not more than 1000 nm.

5. The device according to claim 1, wherein the stacked body further comprises an AlGaN layer of $Al_xGa_{1-x}N$ ($0<x\leq1$) having an upper surface, and the first Si-containing layer contacts the upper surface of the AlGaN layer.

6. The device according to claim 1, wherein the stacked body comprises:
a first portion having a first Si concentration not less than $7\times10^{19}/cm^3$ and not more than $4\times10^{20}/cm^3$,
a second portion having a second Si concentration lower than the first Si concentration,
a third portion provided between the first portion and the second portion and having a third Si concentration, wherein the third Si concentration is lower than the first Si concentration and higher than the second Si concentration,
a fourth portion provided between the third portion and the second portion and having a fourth Si concentration, wherein the fourth Si concentration is lower than the third Si concentration and higher than the second Si concentration, a fifth portion provided between the first portion and the third portion, wherein a Si concentration of the fifth portion changes along a thickness of the fifth portion with a rate higher than a change of Si concentration along a thickness of the third portion, a sixth portion provided between the third portion and the fourth portion, wherein a Si concentration of the sixth portion changes along a thickness of the sixth portion with a rate higher than the change of Si concentration along the thickness of the third portion and higher than a change of Si concentration along a thickness of the fourth portion, and a seventh portion provided between the fourth portion and the second portion, wherein a Si concentration of the seventh portion changes along a thickness of the seventh portion with a rate higher than the change of Si concentration along the thickness of the fourth portion and higher than a change of Si concentration along a thickness of the second portion.

7. The device according to claim 6, wherein the third Si concentration is not less than $3\times10^{18}/cm^3$ and not more than $5\times10^{19}/cm^3$.

8. The device according to claim 6, wherein
a thickness of the first portion is not less than 1 nm and not more than 200 nm,
the thickness of the third portion is not less than 100 nm and not more than 1000 nm, and
the thickness of the fourth portion is not less than 300 nm and not more than 2500 nm.

9. The device according to claim 1, further comprising:
a buffer layer comprising a second nitride semiconductor, wherein the stacked body is provided on the buffer layer.

10. The device according to claim 9, further comprising:
a stacked intermediate layer provided between the buffer layer and the stacked body and comprising:
a GaN intermediate layer;
an AlN intermediate layer provided on the GaN intermediate layer; and
an AlGaN intermediate layer provided on the AlN intermediate layer.

11. The device according to claim 9, further comprising:
a substrate,
wherein the buffer layer is disposed between the substrate and the stacked body.

12. The device according to claim 11, wherein the substrate is a silicon substrate.

13. A nitride semiconductor wafer, comprising:
a substrate;
a buffer layer provided on the substrate and comprising a nitride semiconductor; and
a stacked body provided on the buffer layer and comprising:
a first Si-containing layer comprising Si at a concentration not less than $7\times10^{19}/cm^3$ and not more than $4\times10^{20}/cm^3$, the first Si-containing layer having an upper surface, the upper surface of the first Si-containing layer having a first region and a second region;
a first GaN layer provided on the first region and including a protrusion having an oblique surface tilted with respect to the upper surface of the first Si-containing layer;
a second Si-containing layer provided on the first GaN layer and comprising Si, a portion of the second Si-containing layer physically contacting the second region of the upper surface of the first Si-containing layer; and a second GaN layer provided on the second Si-containing layer and physically contacting the portion of the second Si-containing layer,
wherein the first Si-containing layer comprises a first plurality of discontinuous islands or is a first film having a first opening, and
the second Si-containing layer comprises a second plurality of discontinuous islands or is a second film having a second opening.

14. The wafer according to claim 13, wherein
the first GaN layer comprises a plurality of first dislocations communicating with the oblique surface,
the second GaN layer comprises a plurality of third dislocations, at least one of the third dislocations is continuous with the first dislocations via the second Si-containing layer, and
a number of the third dislocations continuous with the first dislocations is less than a number of the first dislocations.

15. The wafer according to claim 13, wherein
the protrusion of the first GaN layer further comprises a top surface parallel to the upper surface of the first Si-containing layer,
the first GaN layer comprises:
 a plurality of first dislocations communicating with the oblique surface, and
 a plurality of second dislocations communicating with the top surface of the first GaN layer,
the second GaN layer comprises a plurality of third dislocations,
at least one of the third dislocations is continuous with the second dislocations, and
a ratio of a number of the third dislocations continuous with the first dislocations to a number of the plurality of first dislocations is lower than a ratio of a number of the third dislocations continuous with the second dislocations to a number of the second dislocations.

16. The wafer according to claim 13, wherein a height of the protrusion of the first GaN layer is not less than 100 nm and not more than 1000 nm.

17. The wafer according to claim 13, wherein the stacked body further comprises an AlGaN layer of $Al_xGa_{1-x}N$ (0<x≤1) having an upper surface, and the first Si-containing layer contacts the upper surface of the AlGaN layer.

18. The wafer according to claim 13, further comprising:
a stacked intermediate layer provided between the buffer layer and the stacked body and comprising:
 a GaN intermediate layer;
 an AlN intermediate layer provided on the GaN intermediate layer; and
 an AlGaN intermediate layer provided on the AlN intermediate layer.

19. The wafer according to claim 13, wherein the substrate is a silicon substrate.

20. A method for forming a nitride semiconductor layer, comprising:
forming a first Si-containing layer on a buffer layer provided on a substrate, the buffer layer including a nitride semiconductor, the first Si-containing layer comprising Si at a concentration not less than $7 \times 10^{19}/cm^3$ and not more than $4 \times 10^{20}/cm^3$, such that the first Si-containing layer has an upper surface having a first region and a second region;
forming a first GaN layer on the first region of the upper surface of the first Si-containing layer such that the first GaN layer includes a protrusion having an oblique surface tilted with respect to the upper surface of the first Si-containing layer;
forming a second Si-containing layer comprising Si on the first GaN layer such that a portion of the second Si-containing layer physically contacts the second region of the upper surface of the first Si-containing layer; and
forming a second GaN layer on the second Si-containing layer such that the second GaN layer physically contacts the portion of the second Si-containing layer,
wherein the first Si-containing layer comprises a first plurality of discontinuous islands or is a first film having a first opening, and
the second Si-containing layer comprises a second plurality of discontinuous islands or is a second film having a second opening.

21. The method according to claim 20, further comprising:
forming an AlGaN layer of $Al_xGa_{1-x}N$ (0<x≤1) between the first Si-containing layer and the buffer layer such that the first Si-containing layer contacts an upper surface of the AlGaN layer.

22. A nitride semiconductor device, comprising:
a stacked body comprising:
 a first Si-containing layer comprising Si at a concentration not less than $7 \times 10^{19}/cm^3$ and not more than $4 \times 10^{20}/cm^3$, the first Si-containing layer having an upper surface, the upper surface of the first Si-containing layer having a first region and a second region,
 a first GaN layer provided on the first region and including a protrusion having an oblique surface tilted with respect to the upper surface of the first Si-containing layer,
 a second Si-containing layer provided on the first GaN layer and comprising Si, a portion of the second Si-containing layer physically contacting the second region of the upper surface of the first Si-containing layer, and
 a second GaN layer provided on the second Si-containing layer and physically contacting the portion of the second Si-containing layer; and
a functional layer provided on the stacked body and including a nitride semiconductor,
wherein the first Si-containing layer comprises a plurality of discontinuous islands or is a film having an opening, and
the second Si-containing layer comprises SiN.

23. A nitride semiconductor device, comprising:
a stacked body comprising:
 a first Si-containing layer comprising Si at a concentration not less than $7 \times 10^{19}/cm^3$ and not more than $4 \times 10^{20}/cm^3$, the first Si-containing layer having an upper surface, the upper surface of the first Si-containing layer having a first region and a second region,
 a first GaN layer provided on the first region and including a protrusion having an oblique surface tilted with respect to the upper surface of the first Si-containing layer,
 a second Si-containing layer provided on the first GaN layer and comprising Si, a portion of the second Si-containing layer physically contacting the second region of the upper surface of the first Si-containing layer, and a second GaN layer provided on the second Si-containing layer and physically contacting the portion of the second Si-containing layer; and
a functional layer provided on the stacked body and including a nitride semiconductor,
wherein the first Si-containing layer comprises SiN, and the second Si-containing layer comprises a plurality of discontinuous islands or is a film having an opening.

24. A nitride semiconductor device, comprising:
a stacked body comprising:
  a first Si-containing layer comprising Si at a concentration not less than $7\times10^{19}/cm^3$ and not more than $4\times10^{20}/cm^3$, the first Si-containing layer having an upper surface, the upper surface of the first Si-containing layer having a first region and a second region,
  a first GaN layer provided on the first region and including a protrusion having an oblique surface tilted with respect to the upper surface of the first Si-containing layer,
  a second Si-containing layer provided on the first GaN layer and comprising Si, a portion of the second Si-containing layer physically contacting the second region of the upper surface of the first Si-containing layer, and
  a second GaN layer provided on the second Si-containing layer and physically contacting the portion of the second Si-containing layer; and
a functional layer provided on the stacked body and including a nitride semiconductor,
wherein each of the first Si-containing layer and the second Si-containing layer comprises SiN.

25. A nitride semiconductor wafer, comprising:
a substrate;
a buffer layer provided on the substrate and comprising a nitride semiconductor; and
a stacked body provided on the buffer layer and comprising:
  a first Si-containing layer comprising Si at a concentration not less than $7\times10^{19}/cm^3$ and not more than $4\times10^{20}/cm^3$, the first Si-containing layer having an upper surface, the upper surface of the first Si-containing layer having a first region and a second region;
  a first GaN layer provided on the first region and including a protrusion having an oblique surface tilted with respect to the upper surface of the first Si-containing layer;
  a second Si-containing layer provided on the first GaN layer and comprising Si, a portion of the second Si-containing layer physically contacting the second region of the upper surface of the first Si-containing layer; and
  a second GaN layer provided on the second Si-containing layer and physically contacting the portion of the second Si-containing layer,
wherein the first Si-containing layer comprises a plurality of discontinuous islands or is a film having an opening, and
the second Si-containing layer comprises SiN.

26. A nitride semiconductor wafer, comprising:
a substrate;
a buffer layer provided on the substrate and comprising a nitride semiconductor; and
a stacked body provided on the buffer layer and comprising:
  a first Si-containing layer comprising Si at a concentration not less than $7\times10^{19}/cm^3$ and not more than $4\times10^{20}/cm^3$, the first Si-containing layer having an upper surface, the upper surface of the first Si-containing layer having a first region and a second region;
  a first GaN layer provided on the first region and including a protrusion having an oblique surface tilted with respect to the upper surface of the first Si-containing layer;
  a second Si-containing layer provided on the first GaN layer and comprising Si, a portion of the second Si-containing layer physically contacting the second region of the upper surface of the first Si-containing layer; and
  a second GaN layer provided on the second Si-containing layer and physically contacting the portion of the second Si-containing layer,
wherein the first Si-containing layer comprises SiN, and the second Si-containing layer comprises a plurality of discontinuous islands or is a film having an opening.

27. A nitride semiconductor wafer, comprising:
a substrate;
a buffer layer provided on the substrate and comprising a nitride semiconductor; and
a stacked body provided on the buffer layer and comprising:
  a first Si-containing layer comprising Si at a concentration not less than $7\times10^{19}/cm^3$ and not more than $4\times10^{20}/cm^3$, the first Si-containing layer having an upper surface, the upper surface of the first Si-containing layer having a first region and a second region;
  a first GaN layer provided on the first region and including a protrusion having an oblique surface tilted with respect to the upper surface of the first Si-containing layer;
  a second Si-containing layer provided on the first GaN layer and comprising Si, a portion of the second Si-containing layer physically contacting the second region of the upper surface of the first Si-containing layer; and
  a second GaN layer provided on the second Si-containing layer and physically contacting the portion of the second Si-containing layer,
wherein each of the first Si-containing layer and the second Si-containing layer comprises SiN.

28. A method for forming a nitride semiconductor layer, comprising:
forming a first Si-containing layer on a buffer layer provided on a substrate, the buffer layer including a nitride semiconductor, the first Si-containing layer comprising Si at a concentration not less than $7\times10^{19}/cm^3$ and not more than $4\times10^{20}/cm^3$, such that the first Si-containing layer has an upper surface having a first region and a second region;
forming a first GaN layer on the first region of the upper surface of the first Si-containing layer such that the first GaN layer includes a protrusion having an oblique surface tilted with respect to the upper surface of the first Si-containing layer;
forming a second Si-containing layer comprising Si on the first GaN layer such that a portion of the second Si-containing layer physically contacts the second region of the upper surface of the first Si-containing layer; and forming a second GaN layer on the second Si-containing layer such that the second GaN layer physically contacts the portion of the second Si-containing layer, wherein the first Si-containing layer comprises a plurality of discontinuous islands or is a film having an opening, and the second Si-containing layer comprises SiN.

29. A method for forming a nitride semiconductor layer, comprising:

forming a first Si-containing layer on a buffer layer provided on a substrate, the buffer layer including a nitride semiconductor, the first Si-containing layer comprising Si at a concentration not less than $7 \times 10^{19}/$cm$^3$ and not more than $4 \times 10^{20}/$cm$^3$, such that the first Si-containing layer has an upper surface having a first region and a second region;

forming a first GaN layer on the first region of the upper surface of the first Si-containing layer such that the first GaN layer includes a protrusion having an oblique surface tilted with respect to the upper surface of the first Si-containing layer;

forming a second Si-containing layer comprising Si on the first GaN layer such that a portion of the second Si-containing layer physically contacts the second region of the upper surface of the first Si-containing layer; and forming a second GaN layer on the second Si-containing layer such that the second GaN layer physically contacts the portion of the second Si-containing layer, wherein the first Si-containing layer comprises SiN, and the second Si-containing layer comprises a plurality of discontinuous islands or is a film having an opening.

30. A method for forming a nitride semiconductor layer, comprising:

forming a first Si-containing layer on a buffer layer provided on a substrate, the buffer layer including a nitride semiconductor, the first Si-containing layer comprising Si at a concentration not less than $7 \times 10^{19}/$cm$^3$ and not more than $4 \times 10^{20}/$cm$^3$, such that the first Si-containing layer has an upper surface having a first region and a second region;

forming a first GaN layer on the first region of the upper surface of the first Si-containing layer such that the first GaN layer includes a protrusion having an oblique surface tilted with respect to the upper surface of the first Si-containing layer;

forming a second Si-containing layer comprising Si on the first GaN layer such that a portion of the second Si-containing layer physically contacts the second region of the upper surface of the first Si-containing layer; and forming a second GaN layer on the second Si-containing layer such that the second GaN layer physically contacts the portion of the second Si-containing layer, wherein each of the first Si-containing layer and the second Si-containing layer comprises SiN.

* * * * *